US00RE47342E

(19) United States
(12) Reissued Patent
Lloyd et al.

(10) Patent Number: US RE47,342 E
(45) Date of Reissued Patent: Apr. 9, 2019

(54) HIGH SPEED BYPASS CABLE ASSEMBLY

(71) Applicant: Molex, LLC, Lisle, IL (US)

(72) Inventors: Brian Keith Lloyd, Maumelle, AR (US); Christopher David Hirschy, Conway, AR (US); Munawar Ahmad, Maumelle, AR (US); Eran J. Jones, Conway, AR (US); Stephen W. Hamblin, Little Rock, AR (US); Darian Ross Schulz, Little Rock, AR (US); Todd David Ward, Maumelle, AR (US); Gregory B. Walz, Maumelle, AR (US); Ebrahim Abunasrah, Little Rock, AR (US); Rehan Khan, Little Rock, AR (US)

(73) Assignee: Molex, LLC, Lisle, IL (US)

(21) Appl. No.: 15/271,903

(22) Filed: Sep. 21, 2016

Related U.S. Patent Documents

Reissue of:
(64) Patent No.: 9,011,177
Issued: Apr. 21, 2015
Appl. No.: 13/987,296
Filed: Feb. 14, 2011

U.S. Applications:
(63) Continuation-in-part of application No. PCT/US2010/022738, filed on Feb. 1, 2010.
(Continued)

(51) Int. Cl.
*H01R 13/58* (2006.01)
*H01B 11/00* (2006.01)
(Continued)

(52) U.S. Cl.
CPC ..... *H01B 11/00* (2013.01); *H01R 13/6471* (2013.01); *H01R 13/6593* (2013.01);
(Continued)

(58) Field of Classification Search
CPC ..... H01R 13/426; H01R 13/5845; H01R 13/6471; H01R 13/6473; H01R 13/65802;
(Continued)

(56) References Cited

U.S. PATENT DOCUMENTS 3,007,131 A 10/1961 Dahlgren et al.
3,594,613 A 7/1971 Prietula
(Continued)

FOREIGN PATENT DOCUMENTS

DE 3447556 A1 7/1986
DE 3447556 A1 10/1986
(Continued)

OTHER PUBLICATIONS

U.S. Appl. No. 61/714,871, filed Oct. 17, 2012, Wig et al.
(Continued)

*Primary Examiner* — Christopher E. Lee
(74) *Attorney, Agent, or Firm* — Molex, LLC

(57) ABSTRACT

A cable bypass assembly is disclosed for use in providing a high speed transmission line for connecting a board mounted connector of an electronic device to a chip on the device board. The bypass cable assembly has a structure that permits it, where it is terminated to the board mounted connector and the chip member, or closely proximate thereto to replicate closely the geometry of the cable. The connector terminals are arranged in alignment with the cable signal conductors and shield extensions are provided so that shielding can be provided up to and over the termination between the cable signal conductors and the board connector terminal tails. Likewise, a similar termination structure is provided at the opposite end of the cable where a pair of terminals are supported by a second connector body and enclosed in a shield collar. The shield collar has an extension that engages the second end of the cable.

16 Claims, 23 Drawing Sheets

Related U.S. Application Data

(60) Provisional application No. 61/148,685, filed on Jan. 30, 2009.

(51) Int. Cl.
*H05K 1/02* (2006.01)
*H05K 3/22* (2006.01)
*H01R 13/6471* (2011.01)
*H01R 13/6593* (2011.01)

(52) U.S. Cl.
CPC ..... *H05K 1/0243* (2013.01); *H05K 3/222* (2013.01); *H05K 2201/10189* (2013.01); *H05K 2201/10356* (2013.01); *H05K 2201/10446* (2013.01); *H05K 2201/10674* (2013.01)

(58) Field of Classification Search
CPC ..... H01R 9/032; H01R 9/038; H01R 12/592; H01R 23/688; H01R 13/193; H01R 13/512; H01R 13/648; H01R 13/6275; H01R 9/03; H01R 9/035; H01R 24/50; H01R 24/62; H01R 24/64; H01R 23/10; H01R 12/67; H01R 12/675; H05K 1/0219; B29C 45/001; H01L 23/49805; G06F 1/184
USPC ..... 439/108, 76.1, 465, 492, 493, 607.01, 439/607.47, 638, 63, 342, 374, 404, 483, 439/494, 541.5, 579, 709, 79, 98; 361/741; 174/68.1, 261
See application file for complete search history.

(56) References Cited

U.S. PATENT DOCUMENTS 3,963,319 A 6/1976 Schumacher et al.
4,025,141 A 5/1977 Thelissen
4,072,387 A 2/1978 Sochor
4,083,615 A 4/1978 Volinskie
4,157,612 A 6/1979 Rainal
4,290,664 A 9/1981 Davis et al.
4,307,926 A 12/1981 Smith
4,346,355 A 8/1982 Tsukii
4,417,779 A 11/1983 Wilson
4,508,403 A * 4/1985 Weltman ..... H01R 23/10 439/494
4,611,186 A 9/1986 Ziegner
4,615,578 A * 10/1986 Stadler et al. ..... 439/607.47
4,639,054 A 1/1987 Kersbergen
4,656,441 A 4/1987 Takahashi et al.
4,657,329 A * 4/1987 Dechelette ..... H01R 12/67 439/404
4,679,321 A 7/1987 Plonski
4,697,862 A 10/1987 Hasircoglu
4,724,409 A 2/1988 Lehman
4,889,500 A * 12/1989 Lazar et al. ..... 439/579
4,924,179 A 5/1990 Sherman
4,948,379 A 8/1990 Evans
4,984,992 A 1/1991 Beamenderfer et al.
4,991,001 A 2/1991 Takubo et al.
5,112,251 A 5/1992 Cesar
5,197,893 A 3/1993 Morlion et al.
5,332,979 A 7/1994 Roskewitsch
5,387,130 A 2/1995 Fedder et al.
5,402,088 A 3/1995 Pierro et al.
5,435,757 A 7/1995 Fedder et al.
5,441,424 A 8/1995 Morlion et al.
5,487,673 A 1/1996 Hurtarte
5,509,827 A 4/1996 Huppenthal et al.
5,554,038 A 9/1996 Morlion et al.
5,598,627 A 2/1997 Saka et al.
5,632,634 A 5/1997 Soes
5,691,506 A 11/1997 Miyazaki et al.
5,781,759 A 7/1998 Kashiwabara
6,004,139 A 12/1999 Dramstad
6,053,770 A 4/2000 Blom
6,083,046 A 7/2000 Wu et al.
6,095,872 A 8/2000 Lang
6,144,559 A 11/2000 Johnson et al.
6,156,981 A 12/2000 Ward et al.
6,203,376 B1 * 3/2001 Magajne ..... H01R 13/5845 439/465
6,255,741 B1 7/2001 Yoshihara
6,266,712 B1 7/2001 Henrichs
6,273,753 B1 8/2001 Ko
6,273,758 B1 * 8/2001 Lloyd et al. ..... 439/607.01
6,366,471 B1 4/2002 Edwards et al.
6,368,120 B1 4/2002 Scherer
6,371,788 B1 4/2002 Bowling et al.
6,452,789 B1 9/2002 Pallotti et al.
6,489,563 B1 12/2002 Zhao et al.
6,535,367 B1 3/2003 Carpenter
6,574,115 B2 6/2003 Asano et al.
6,575,772 B1 6/2003 Soubh et al.
6,592,401 B1 7/2003 Gardner et al.
6,652,296 B2 11/2003 Kuroda et al.
6,652,318 B1 11/2003 Winings et al.
6,685,501 B1 * 2/2004 Wu ..... H01R 13/6471 439/493
6,692,262 B1 2/2004 Loveless
6,705,893 B1 3/2004 Ko
6,780,069 B2 8/2004 Scherer
6,797,891 B1 9/2004 Blair et al.
6,824,426 B1 * 11/2004 Spink, Jr. ..... H01R 24/62 439/579
6,843,657 B2 1/2005 Driscoll et al.
6,882,241 B2 4/2005 Abo et al.
6,903,934 B2 6/2005 Lo
6,910,914 B1 6/2005 Spink, Jr.
6,916,183 B2 7/2005 Alger et al.
6,955,565 B2 * 10/2005 Lloyd et al. ..... 439/607.01
6,969,270 B2 * 11/2005 Renfro ..... H01R 13/193 439/342
6,969,280 B2 11/2005 Chien
6,971,887 B1 12/2005 Trobough
7,004,765 B2 * 2/2006 Hsu ..... H01R 24/64 439/541.5
7,004,793 B2 2/2006 Scherer
7,044,772 B2 * 5/2006 McCreery ..... H01R 12/675 439/493
7,052,292 B2 5/2006 Hsu et al.
7,056,128 B2 6/2006 Driscoll et al.
7,066,756 B2 6/2006 Lange et al.
7,070,446 B2 7/2006 Henry
7,108,522 B2 9/2006 Verelst et al.
7,148,428 B2 12/2006 Meier et al.
7,168,961 B2 1/2007 Hsieh
7,175,446 B2 2/2007 Bright
7,192,300 B2 3/2007 Hashiguchi et al.
7,214,097 B1 * 5/2007 Hsu ..... H01R 13/65802 439/607.47
7,223,915 B2 * 5/2007 Hackman ..... 174/36
7,234,944 B2 6/2007 Nordin
7,244,137 B2 7/2007 Renfro et al.
7,280,372 B2 10/2007 Grundy et al.
7,307,293 B2 * 12/2007 Fjelstad ..... H01L 23/49805 174/110 R
7,331,816 B2 2/2008 Krohn
7,384,275 B2 6/2008 Ngo
7,394,665 B2 7/2008 Hamasaki et al.
7,402,048 B2 7/2008 Meier et al.
7,431,608 B2 10/2008 Sakaguchi et al.
7,445,471 B1 11/2008 Scherer et al.
7,462,924 B2 12/2008 Shuey
7,489,514 B2 2/2009 Hamasaki
7,534,142 B2 5/2009 Avery
7,540,773 B2 6/2009 Ko
7,549,897 B2 6/2009 Fedder
7,621,779 B2 11/2009 Laurx et al.
7,637,767 B2 12/2009 Davis
7,654,831 B1 * 2/2010 Wu ..... 439/76.1
7,658,654 B2 2/2010 Ohyama

(56) References Cited

U.S. PATENT DOCUMENTS 7,690,930 B2 * 4/2010 Chen ..... H01R 9/038 439/76.1
7,719,843 B2 5/2010 Dunham
7,744,385 B2 6/2010 Scherer
7,744,403 B2 6/2010 Barr
7,744,414 B2 6/2010 Scherer et al.
7,748,988 B2 7/2010 Hori
7,771,207 B2 8/2010 Hamner et al.
7,789,529 B2 9/2010 Roberts
7,819,675 B2 10/2010 Ko et al.
7,824,197 B1 11/2010 Westman
7,857,629 B2 12/2010 Chin
7,857,630 B2 12/2010 Hermant et al.
7,862,344 B2 1/2011 Morgan et al.
7,892,019 B2 2/2011 Rao
7,906,730 B2 3/2011 Atkinson et al.
7,931,502 B2 4/2011 Iida
7,985,097 B2 7/2011 Gulla
7,997,933 B2 8/2011 Feldman
8,002,583 B2 8/2011 van Woensel
8,018,733 B2 9/2011 Jia
8,036,500 B2 10/2011 McColloch
8,157,573 B2 4/2012 Tanaka
8,162,675 B2 4/2012 Regnier
8,187,038 B2 5/2012 Kamiya
8,192,222 B2 6/2012 Kameyama
8,226,441 B2 7/2012 Regnier
8,308,491 B2 11/2012 Nichols et al.
8,337,243 B2 12/2012 Elkhatib et al.
8,338,713 B2 12/2012 Fjelstad et al.
8,398,433 B1 3/2013 Yang
8,419,472 B1 4/2013 Swanger et al.
8,435,074 B1 5/2013 Grant
8,439,704 B2 5/2013 Reed
8,449,312 B2 5/2013 Lang
8,449,330 B1 5/2013 Schroll
8,465,302 B2 6/2013 Regnier
8,480,413 B2 7/2013 Minich
8,517,765 B2 8/2013 Schroll
8,535,069 B2 9/2013 ZHang
8,540,525 B2 9/2013 Regnier
8,553,102 B2 10/2013 Yamada
8,575,491 B2 11/2013 Gundel et al.
8,575,529 B2 11/2013 Asahi
8,588,561 B2 11/2013 Zbinden
8,597,055 B2 12/2013 Regnier
8,651,890 B2 2/2014 Chiarelli
8,672,707 B2 3/2014 Nichols et al.
8,690,604 B2 4/2014 Davis
8,715,003 B2 5/2014 Buck et al.
8,740,644 B2 6/2014 Long
8,747,158 B2 6/2014 Szczesny
8,753,145 B2 6/2014 Lang
8,758,051 B2 6/2014 Nonen et al.
8,764,483 B2 7/2014 Ellison
8,784,122 B2 7/2014 Soubh
8,787,711 B2 7/2014 Zbinden
8,794,991 B2 8/2014 Ngo
8,804,342 B2 8/2014 Behziz et al.
8,814,595 B2 8/2014 Cohen et al.
8,834,190 B2 9/2014 Ngo
8,864,521 B2 10/2014 Atkinson et al.
8,888,533 B2 11/2014 Westman et al.
8,905,767 B2 12/2014 Putt, Jr. et al.
8,911,255 B2 12/2014 Scherer et al.
8,926,342 B2 1/2015 Vinther
8,926,377 B2 1/2015 Kirk
8,992,236 B2 3/2015 Wittig
8,992,237 B2 3/2015 Regnier
8,992,258 B2 3/2015 Raschilla
9,011,177 B2 4/2015 Lloyd
9,028,281 B2 5/2015 Kirk
9,035,183 B2 5/2015 Kodama et al.
9,040,824 B2 5/2015 Guetig et al.
9,054,432 B2 6/2015 Yang
9,071,001 B2 6/2015 Scherer et al.
9,119,292 B2 8/2015 Gundel
9,136,652 B2 9/2015 Ngo
9,142,921 B2 9/2015 Wanha et al.
9,155,214 B2 10/2015 Ritter
9,160,123 B1 10/2015 Pao
9,160,151 B2 10/2015 Vinther
9,161,463 B2 10/2015 Takamura
9,166,320 B1 10/2015 Herring
9,196,983 B2 11/2015 Saur et al.
9,203,171 B2 12/2015 Yu
9,209,539 B2 12/2015 Herring
9,214,756 B2 12/2015 Nishio
9,214,768 B2 12/2015 Pao
9,232,676 B2 1/2016 Sechrist et al.
9,246,251 B2 1/2016 Regnier
9,277,649 B2 3/2016 Ellison
9,312,618 B2 4/2016 Regnier
9,331,432 B1 5/2016 Phillips
9,350,108 B2 5/2016 Long
9,356,366 B2 5/2016 Moore
9,385,455 B2 7/2016 Regnier
9,391,407 B1 7/2016 Bucher
9,401,563 B2 7/2016 Simpson
9,413,090 B2 8/2016 Nagamine
9,413,112 B2 8/2016 Helster
9,431,773 B2 8/2016 Chen
9,437,981 B2 9/2016 Wu
9,455,538 B2 9/2016 Nishio
9,484,671 B2 11/2016 Zhu
9,484,673 B1 11/2016 Yang
9,490,587 B1 11/2016 Phillips
9,496,655 B1 11/2016 Huang
9,515,429 B2 12/2016 DeGeest
9,525,245 B2 12/2016 Regnier
9,543,688 B2 1/2017 Pao
9,553,381 B2 1/2017 Regnier
9,559,465 B2 1/2017 Phillips
9,565,780 B2 2/2017 Nishio
9,608,388 B2 3/2017 Kondo
9,608,590 B2 3/2017 Hamner
9,627,818 B1 4/2017 Chen
9,660,364 B2 5/2017 Wig et al.
9,666,998 B1 5/2017 deBoer
9,673,570 B2 6/2017 Briant
9,812,799 B2 11/2017 Wittig
9,985,367 B2 5/2018 Wanha et al.
2001/0016438 A1 8/2001 Reed
2002/0111067 A1 8/2002 Sakurai et al.
2002/0157865 A1 * 10/2002 Noda ..... H05K 1/0219 174/261
2002/0180554 A1 12/2002 Clark et al.
2003/0064616 A1 4/2003 Reed et al.
2003/0073331 A1 * 4/2003 Peloza ..... H01R 13/6473 439/108
2003/0222282 A1 12/2003 Fjelstad et al.
2004/0029406 A1 * 2/2004 Loveless ..... H01R 24/50 439/63
2004/0094328 A1 5/2004 Fjelstad et al.
2004/0121633 A1 * 6/2004 David ..... H01R 13/6471 439/108
2004/0155328 A1 8/2004 Kline
2004/0155734 A1 8/2004 Kosemura et al.
2004/0229510 A1 * 11/2004 Lloyd et al. ..... H01R 9/032 439/607.01
2004/0264894 A1 12/2004 Cooke
2005/0006126 A1 * 1/2005 Aisenbrey ..... B29C 45/0013 174/68.1
2005/0051810 A1 3/2005 Funakura
2005/0093127 A1 5/2005 Fjelstad et al.
2005/0130490 A1 * 6/2005 Rose ..... H01R 13/512 439/483
2005/0142944 A1 6/2005 Ling
2005/0239339 A1 10/2005 Pepe
2006/0001163 A1 1/2006 Kolbehdari et al.
2006/0035523 A1 2/2006 Kuroda et al.
2006/0038287 A1 2/2006 Hamasaki

(56) References Cited

U.S. PATENT DOCUMENTS

| | | | | |
|---|---|---|---|---|
| 2006/0067066 | A1* | 3/2006 | Meier | G06F 1/184 361/785 |
| 2006/0079102 | A1 | 4/2006 | DeLessert | |
| 2006/0079119 | A1* | 4/2006 | Wu | H01R 12/592 439/492 |
| 2006/0091507 | A1 | 5/2006 | Fjelstad et al. | |
| 2006/0114016 | A1 | 6/2006 | Suzuki | |
| 2006/0160399 | A1* | 7/2006 | Dawiedczyk | H01R 13/6275 439/374 |
| 2006/0189212 | A1 | 8/2006 | Avery | |
| 2006/0194475 | A1 | 8/2006 | Miyazaki | |
| 2006/0216969 | A1 | 9/2006 | Bright | |
| 2006/0228922 | A1 | 10/2006 | Morriss | |
| 2006/0234556 | A1 | 10/2006 | Wu | |
| 2006/0238991 | A1 | 10/2006 | Drako | |
| 2006/0282724 | A1 | 12/2006 | Roulo | |
| 2006/0292898 | A1 | 12/2006 | Meredith | |
| 2007/0032104 | A1 | 2/2007 | Yamada | |
| 2007/0141871 | A1 | 6/2007 | Scherer | |
| 2007/0243741 | A1 | 10/2007 | Yang | |
| 2008/0131997 | A1 | 6/2008 | Kim et al. | |
| 2008/0171476 | A1* | 7/2008 | Liu | H01R 9/035 439/709 |
| 2008/0297988 | A1* | 12/2008 | Chau | H01R 13/426 361/741 |
| 2008/0305689 | A1* | 12/2008 | Zhang | H01R 23/688 439/638 |
| 2009/0023330 | A1 | 1/2009 | Stoner et al. | |
| 2009/0166082 | A1 | 7/2009 | Liu et al. | |
| 2009/0215309 | A1 | 8/2009 | Mongold | |
| 2010/0068944 | A1 | 3/2010 | Scherer | |
| 2010/0112850 | A1 | 5/2010 | Rao | |
| 2010/0159829 | A1 | 6/2010 | McCormack | |
| 2010/0177489 | A1 | 7/2010 | Yagisawa | |
| 2010/0203768 | A1 | 8/2010 | Kondo | |
| 2011/0074213 | A1 | 3/2011 | Schaffer | |
| 2011/0080719 | A1 | 4/2011 | Jia | |
| 2011/0136387 | A1 | 6/2011 | Matsuura | |
| 2011/0212633 | A1 | 9/2011 | Regnier | |
| 2011/0230104 | A1 | 9/2011 | Lang | |
| 2011/0263156 | A1 | 10/2011 | Ko | |
| 2011/0300757 | A1 | 12/2011 | Regnier | |
| 2011/0304966 | A1 | 12/2011 | Schrempp | |
| 2012/0003848 | A1 | 1/2012 | Casher | |
| 2012/0034820 | A1 | 2/2012 | Lang | |
| 2012/0225585 | A1 | 9/2012 | Lee | |
| 2012/0246373 | A1 | 9/2012 | Chang | |
| 2013/0005178 | A1 | 1/2013 | Straka et al. | |
| 2013/0012038 | A1 | 1/2013 | Kirk | |
| 2013/0017715 | A1 | 1/2013 | Laarhoven | |
| 2013/0040482 | A1 | 2/2013 | Ngo | |
| 2013/0092429 | A1 | 4/2013 | Ellison | |
| 2013/0148321 | A1 | 6/2013 | Liang | |
| 2013/0340251 | A1 | 12/2013 | Regnier | |
| 2014/0041937 | A1* | 2/2014 | Lloyd et al. | 174/74 R |
| 2014/0073173 | A1 | 3/2014 | Yang | |
| 2014/0073174 | A1 | 3/2014 | Yang | |
| 2014/0073181 | A1 | 3/2014 | Yang | |
| 2014/0111293 | A1 | 4/2014 | Madeberg et al. | |
| 2014/0217571 | A1 | 8/2014 | Ganesan et al. | |
| 2014/0242844 | A1 | 8/2014 | Wanha | |
| 2014/0273551 | A1 | 9/2014 | Resendez | |
| 2014/0273594 | A1 | 9/2014 | Jones et al. | |
| 2014/0335736 | A1 | 11/2014 | Regnier | |
| 2015/0079845 | A1 | 3/2015 | Wanha | |
| 2015/0090491 | A1 | 4/2015 | Dunwoody | |
| 2015/0180578 | A1 | 6/2015 | Leigh et al. | |
| 2015/0207247 | A1 | 9/2015 | Chen et al. | |
| 2016/0013596 | A1 | 1/2016 | Regnier | |
| 2016/0064119 | A1 | 3/2016 | Grant | |
| 2016/0104956 | A1 | 4/2016 | Santos | |
| 2016/0181713 | A1 | 6/2016 | Peloza | |
| 2016/0190720 | A1 | 6/2016 | Lindkamp | |
| 2016/0190747 | A1 | 6/2016 | Regnier | |
| 2016/0197423 | A1 | 7/2016 | Regnier | |
| 2016/0218455 | A1 | 7/2016 | Sayre | |
| 2016/0233598 | A1 | 8/2016 | Wittig | |
| 2016/0233615 | A1 | 8/2016 | Scholeno | |
| 2016/0336692 | A1 | 11/2016 | Champion | |
| 2016/0380383 | A1 | 12/2016 | Lord | |
| 2017/0033482 | A1 | 2/2017 | Liao | |
| 2017/0033509 | A1 | 2/2017 | Liao | |
| 2017/0077621 | A1 | 3/2017 | Liao | |
| 2017/0098901 | A1 | 4/2017 | Regnier | |
| 2017/0110222 | A1 | 4/2017 | Liptak et al. | |
| 2017/0162960 | A1 | 6/2017 | Wanha | |
| 2017/0302036 | A1 | 10/2017 | Regnier | |
| 2017/0365942 | A1 | 12/2017 | Regnier | |
| 2018/0034175 | A1 | 2/2018 | Lloyd | |

FOREIGN PATENT DOCUMENTS

| | | | |
|---|---|---|---|
| JP | 02-079571 | | 6/1990 |
| JP | 04-14372 | U1 | 2/1992 |
| JP | 05-059761 | U | 8/1993 |
| JP | 2008-041285 | A | 2/2008 |
| JP | 2008-059857 | A | 3/2008 |
| JP | 2009-043590 | A | 2/2009 |
| JP | 2010-017388 | A | 1/2010 |
| JP | 2010-123274 | A | 6/2010 |
| JP | 2013-016394 | A | 1/2013 |
| TW | M359141 | U | 6/2009 |
| TW | M408835 | U | 8/2011 |
| TW | 201225455 | A | 6/2012 |
| WO | WO 2008-072322 | | 6/2008 |
| WO | WO 2012-078434 | A2 | 6/2012 |
| WO | WO 2013-006592 | A2 | 1/2013 |

OTHER PUBLICATIONS

Agilent, "Designing Scalable 10G Backplane Interconnect Systems Utilizing Advanced Verification Methodologies," White Paper, Published May 5, 2012, USA.

Amphenol Aerospace, "Size 8 High Speed Quadrax and Differential Twinax Contacts for Use in MIL-DTL-38999 Special Subminiature Cylindrical and ARINC 600 Rectangular Connectors", published May 2008. Retrieved from www.peigenesis.com/images/content/news/amphenol_quadrax.pdf.

Hitachi Cable America Inc., "Direct Attach Cables: OMNIBIT supports 25 Gbit/s interconnections". Retrieved Aug. 10, 2017 from www.hca.hitachi-cable.com/products/hca/catalog/pdfs/direct-attach-cable-assemblies.pdf.

Amphenol TCS, "Amphenol TCS expands the XCede Platform with 85 Ohm Connectors and High-Speed Cable Solutions," Press Release, Published Feb. 25, 2009, http://www.amphenol.com/about/news_archive/2009/58.

"File:Wrt54gl-layout.jpg-Embedded Xinu", Internet Citation, Sep. 8, 2006. Retrieved from the Internet: URL:http://xinu.mscs.edu/File:Wrt54gl-layout.jpg [retrieved on Sep. 23, 2014].

* cited by examiner

HIGH SPEED BYPASS CABLE ASSEMBLY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This is a reissue application of U.S. Pat. No. 9,011,177, Issued Apr. 21, 2015.*

REFERENCE To RELATED APPLICATIONS

The Present Disclosure is a continuation-in-part of International Application No. PCT/US2010/022738, filed Feb. 1, 2010, entitled "High Speed Interconnect Cable Assembly," filed 01 Feb. 2010 with the U.S. Patent And Trademark Office (USPTO) as Receiving Office for the Patent Cooperation Treaty. The '738 Application claims priority of prior-filed U.S. Provisional Application No. 61/145,685, entitled "High Speed Interconnect Cable Assembly," filed 30 Jan. 2009 also with the USPTO. The contents of each of the above Applications are fully incorporated in their entireties herein.

BACKGROUND OF THE PRESENT DISCLOSURE

The Present Disclosure relates generally to cable interconnection systems, and more particularly, to bypass cable interconnection systems for transmitting high speed signals at low losses.

Conventional cable interconnection systems are found in electronic devices such as routers and servers and the like, and are used to form a signal transmission line that extends between a primary chip member mounted on a printed circuit board of the device, such as an ASIC, and a connector mounted to the circuit board. The transmission line typically takes the form of a plurality of conductive traces that are etched, or otherwise formed on or as part of the printed circuit board. These traces extend between the chip member and a connector that provides a connection between one or more external plug connectors and the chip member. Circuit boards are usually formed from a material known as FR-4, which is inexpensive. However, FR-4 is known to promote losses in high speed signal transmission lines, and these losses make it undesirable to utilize FR-4 material for high speed applications (10 GHz and above). Custom materials for circuit boards are available that reduce such losses but the price of these materials severely increase the cost of the circuit board and, consequently, the electronic devices in which they are used. Additionally, when traces are used to form the signal transmission line, the overall length of the transmission line typically may well exceed 10 inches in length. These long lengths require that the signals traveling through the transmission line be amplified and repeated, thereby increasing the cost of the circuit board, and complicating the design inasmuch as additional board space is needed to accommodate these amplifiers and repeaters. In addition, the routing of the traces of such a transmission line in the FR-4 may require multiple turns and the transitions which occur at terminations affect the integrity of the signals transmitted thereby. It becomes difficult to route transmission line traces in a manner so as to achieve consistent impedance and a low signal loss therethrough.

The Present Disclosure is therefore directed to a high speed, bypass cable assembly that defines a transmission line for transmitting high speed signals, 10 GHz and greater that removes the transmission line from on the circuit board and which has low loss characteristics.

SUMMARY OF THE PRESENT DISCLOSURE

Accordingly, there is provided an improved high speed bypass cable assembly that defines a signal transmission line useful for high speed applications at 10 GHz or above and with low loss characteristics.

In accordance with an embodiment as described in the disclosure, an electrical connector assembly is disclosed. The electrical connector assembly comprises a printed circuit board, a chip member, a termination member, a first connector member, a bypass cable member and a second connector member. The chip member and the termination member are mounted on the printed circuit board, with the termination member mounted toward the end of the printed circuit board. The first connector member is in electrical communication with the chip member at a first end, and the bypass cable member electrically connects the first connector member, where it is coupled at a second end thereof, and the termination member, at a first end. The second connector member, disposed at a second end of the termination member, is in electrical communication with the termination member. Generally, the electrical connector is capable of the transmission of high speed signals. As the chip member is located a long length from the board connector, the bypass cable provides a transmission line therebetween that has a consistent geometry and structure that resists signal loss and maintains the system impedance at a consistent level without discontinuities.

In accordance with a second embodiment of the disclosure, the cable bypass assembly provides a transmission line that is separate from the circuit board, and may include one or more associated signal wire pairs, such as is found in "twin-ax" cable. The wires of the bypass cable are configured at their opposite ends in two fashions. At a first end of the bypass cable, the wires are configured for a direct termination to a board mounted connector, and are arranged in a manner such that the conductors of the signal wires extend in alignment with terminal termination ends, or feet, of the board mounted connector. The shielding of the signal wires are rolled back upon the insulative coating of the wires and exterior shield extensions are preferably provided to ensure that the signal wire conductor leads are effectively shielded through the connection. In this manner of connection, the terminal tails need not be attached to the circuit board, either as surface mount or through hole tails, thereby significantly reducing losses and the impedance discontinuity that occurs in the tail to board mounting transition.

At the second end of the bypass cable the signal wires are terminated in a fashion so that they can either be connected directly to the chip member or to the board in close proximity to the chip member. In this regard, and as disclosed in this second embodiment, the signal wire conductors are terminated to associated tail portions that are aligned with the conductors, similar to the termination which occurs at the first end. These tails are maintained in a desired spacing and are further completely shielded by a surrounding conductive enclosure to provide full EMI shielding and reduction of cross talk. The termination of the ends of the bypass cable assembly are done in a manner such that to the extent possible, the geometry of the conductors in the bypass cable is maintained through the termination of the cable to the board connector and/or the chip.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Application, are not absolute, but relative. These representations are appropriate when the elements are in the position shown in the Figures. If the description of the position of the elements changes, however, these representations are to be changed accordingly.

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

FIGS. 1-5 provide various perspective views of some basic components of a high speed interconnect cable assembly, developed in accordance with the teachings and tenets of the Present Disclosure.

Figure 1:
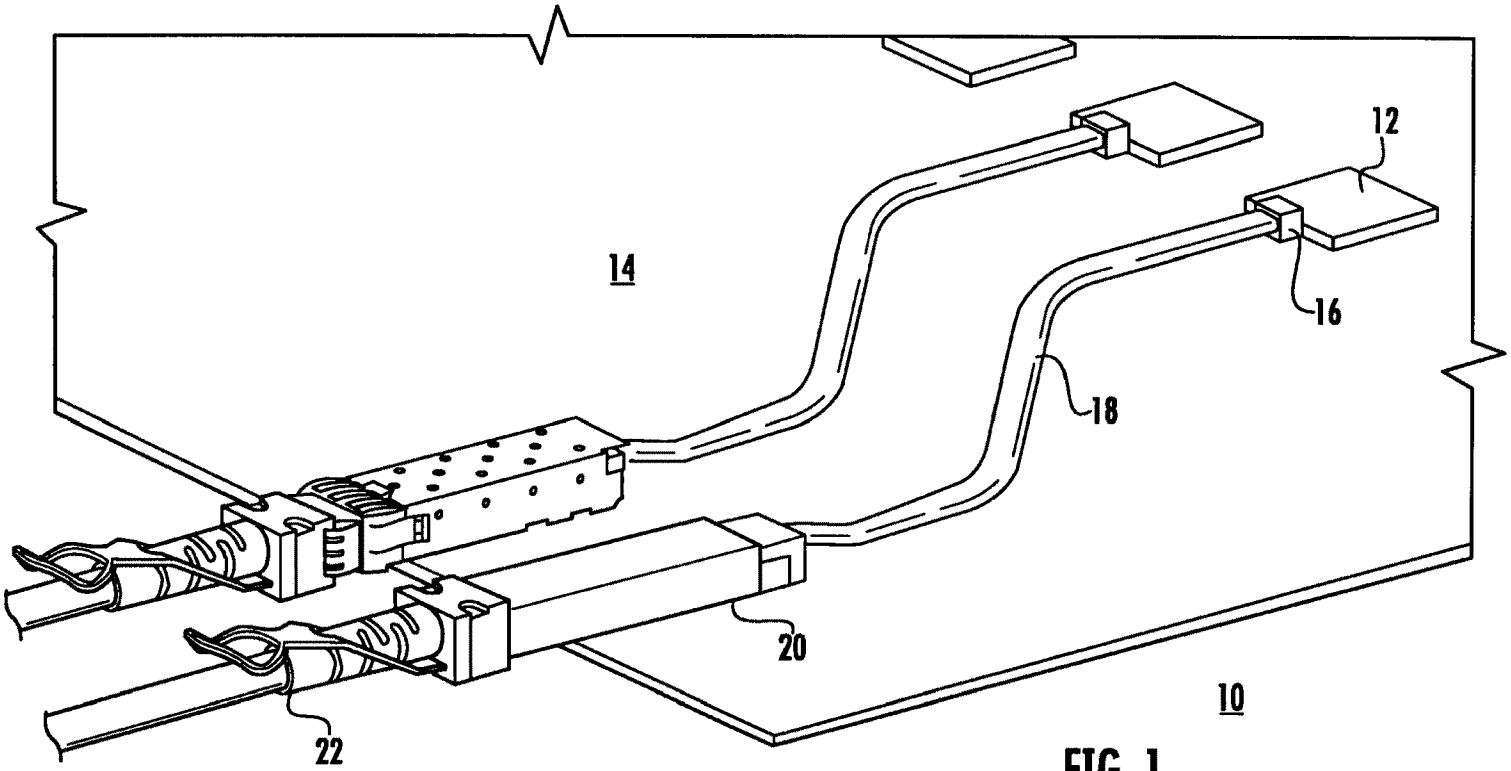
FIG. 1 illustrates a perspective view of one embodiment of a high speed interconnect cable assembly, developed in accordance with the Present Disclosure.

Referring more specifically to FIG. 1, high speed interconnect cable assembly 10 generally comprises chip member 12 mounted on printed circuit board member 14, first connector member 16 interfacing between chip member 12 and bypass cable member 18, and termination member 20 interfacing between bypass cable member 18 and second connector member 22 disposed at the edge of printed circuit board member 14.

Preferably, chip member 12 may comprise a PHY Chip, or any other surface-mounted, physical layer device, known in the art, from which a high speed signal is generated, such as an ASIC and transmitted to a cable assembly. Chip member 12 is mounted to any currently-known printed circuit board, using preferably any of the various currently-known mounting means. Preferably, an FR-4 type printed circuit board is used, in an effort to take advantage of its low cost and wide usage. For purposes of the Present Disclosure, the generated high speed signal may be any type of signal, but typically a data signal, generally having a frequency of 5 GHz and above, and most preferably and is a data signal having a frequency of 10 GHz or more.

Bypass cable member 18 is connected to chip member 12 by means of first connector member 16. First connector member 16 is capable of transmitting a signal greater than 10 GHz between chip member 12 and bypass cable member 18. The interface between first connector member 16 and chip member 18 may be by any known means, including, for example, a plug-receptacle connection, a friction-based connection or the like. It is preferred that the interface be removable. First connector member 16 is preferably capable of receiving the high speed signal generated by the chip member and transmitting it to the bypass cable member without need for a repeater or an amplifier, and without having to use the conductive properties of printed circuit board 14.

Bypass cable member 18 comprises a flexible circuit member, such as a cable, extending from first connector member 16 to termination member 20. Preferably, bypass cable member 18 is capable of receiving and carrying signals above 10 GHz. Preferably, bypass cable member 18 includes one or more wire pairs that transmit differential signals at high speeds. Each such wire pair may have a ground, or drain, wire associated with it. Further, the pairs may be enclosed within bypass cable member 18 and within an associated cable shield. Like first connector member 16, bypass cable member 18 is preferably capable of receiving the high speed signal generated by first connector member 18 and transmitting it to termination member 20 without need for a repeater or an amplifier, and without having to use the conductive properties of printed circuit board 14.

Termination member 20 is electrically connected to bypass cable member 18, and receives the signal from bypass cable member 18. Like all other elements in interconnection assembly 10, termination member 20 is capable of receiving signals greater than 10 GHz. Preferably, termination member 20 is located at or near the edge of printed circuit board 14. Termination member 20 may be mounted to the edge of printed circuit board 14. Alternatively, termination member 20 may be "freestanding," and not connected to any aspect of assembly 10. Termination member 20 may receive bypass cable member 18 though any methods and means as currently described in the art.

Second connector member 22 preferably provides one end of a male-female relationship with termination member 20 (with termination member 20 providing the second end). It is not imperative that second connector member 22 (or termination member 20) be specifically relegated to the male or female end, as the teachings of the Present Disclosure will nevertheless be realized.

Second connector member 22 is preferably not disposed on any other aspect of interconnection assembly 10 of the Present Disclosure, i.e., second connector member 22 is not mounted on printed circuit board 14. Second connector member 22 receives the signal from termination member 20, and transmits the signal to its next or final destination.

Figure 2:
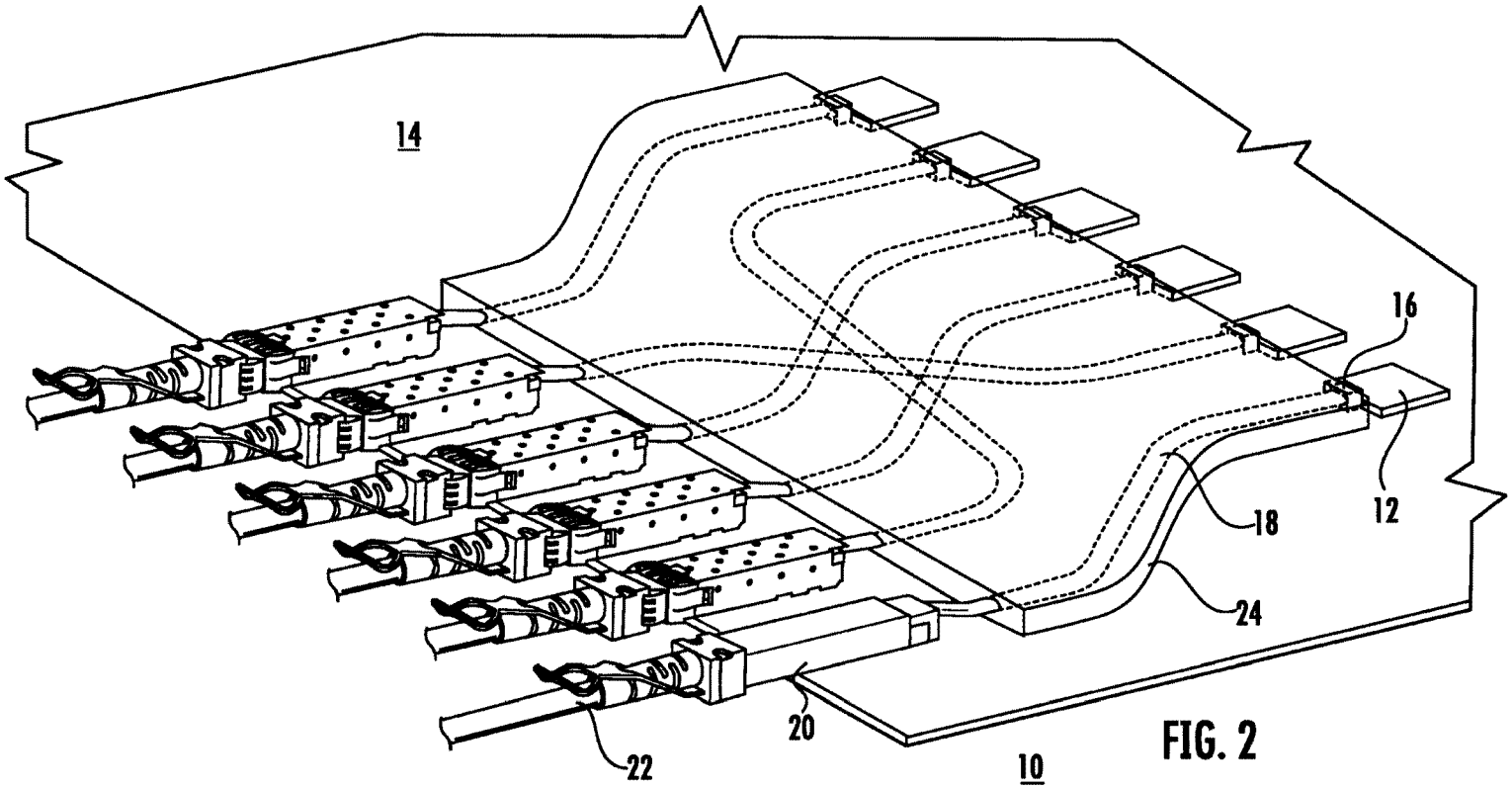
FIG. 2 illustrates a perspective view of another embodiment of a high speed interconnect cable assembly, developed in accordance with the Present Disclosure.

The discussion above focused on a single interconnection assembly. Nevertheless, a plurality of interconnection assemblies may be used on a single printed circuit board, each generally comprising the above-referenced elements. A plurality of assemblies is generally illustrated in FIG. 1. Further, in a second embodiment, which is illustrated in FIG. 2, lamination member 24 may encompass all or part of multiple bypass cable members 18 for ease in assembly, as well as to maintain order on printed circuit board 14 and reduce the cost of assembly 10. Preferably, lamination member 24 may comprise a rigid, formable polymer material that can be molded over both first connector member 16 and bypass cable member 18.

Figure 3:
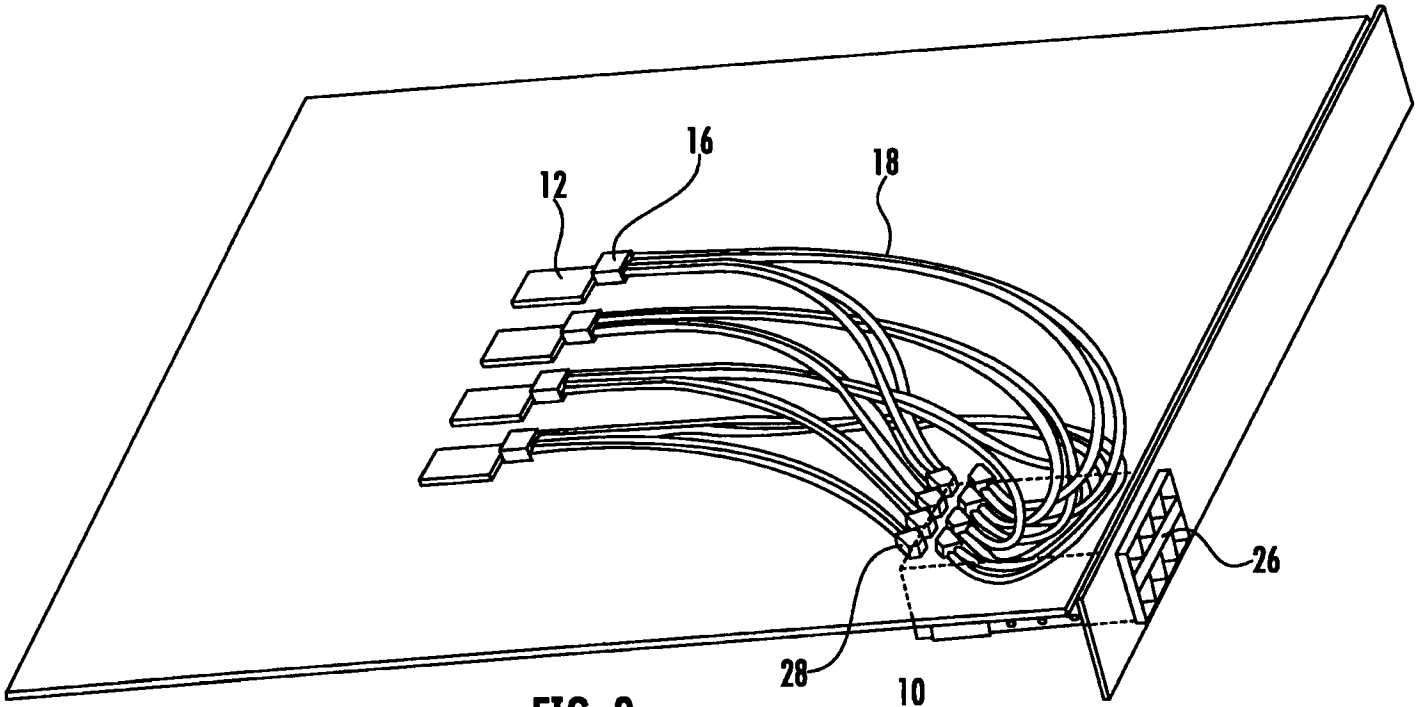
FIG. 3 illustrates a perspective view of another embodiment of a high speed interconnect cable assembly, developed in accordance with the Present Disclosure.

Further, in another embodiment, a plurality of interconnection assemblies, used on a single printed circuit board, may be channeled to a single termination member 26 for transmission of signals beyond the printed circuit board. As illustrated in FIG. 3, bypass cable members 18 extend from chip members 12, via first connector member 16, towards first via transfer connectors 28. Each via transfer connector 28 allows the signal being carried in bypass cable members 18 to pass through holes (or vias) in the printed circuit board where they connect with termination member 26.

Figure 4:
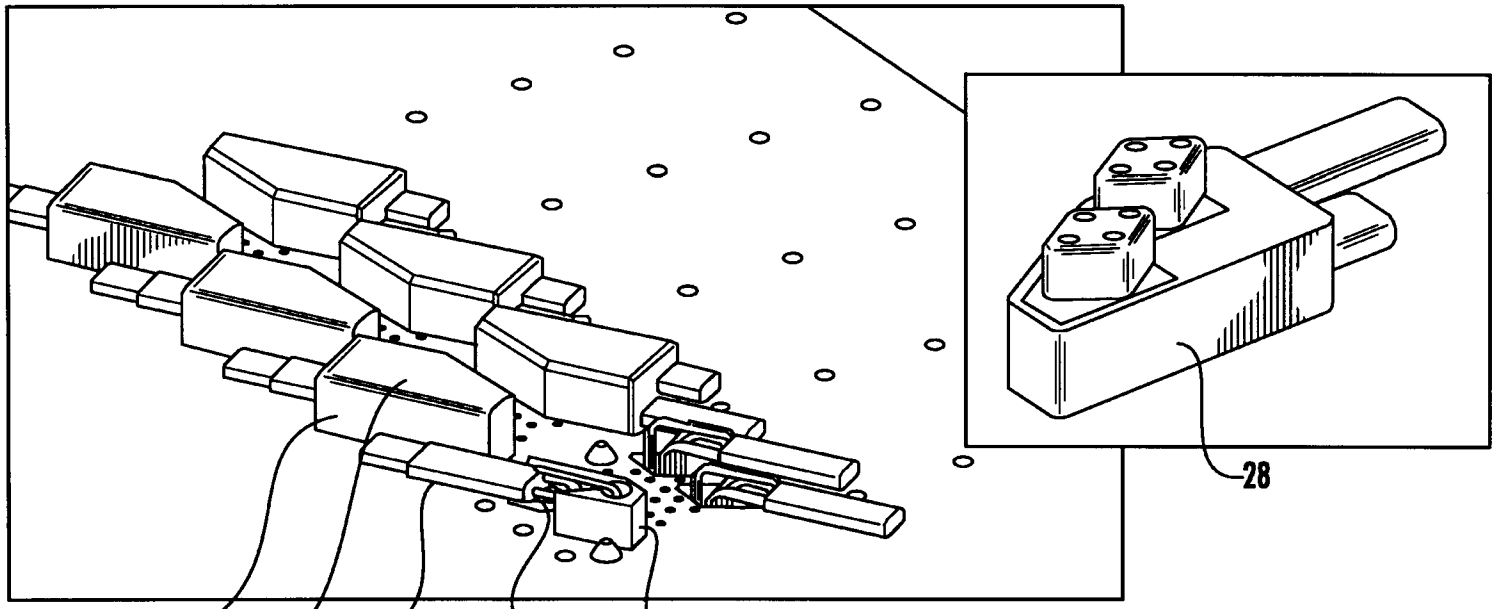
FIG. 4 illustrates a perspective and inset view of the via transfer connector of the interconnect cable assembly of FIG. 3.

FIG. 4 illustrates a perspective close up of the connection of via transfer connectors 28 to termination member (not shown in FIG. 4). As illustrated, each via transfer connector 28 houses the termination of bypass cable members 18. Individual wires 30 extending from bypass cable members 18 are mounted within connector housing 32. Connector housing 32, along with individual wires 30 and a portion of bypass cable members 18, are overmolded with terminal housing [34] *38*. Terminal housing [34] *38* is then inserted into the via hole of the printed circuit board, where it couples to termination member.

Figure 5:
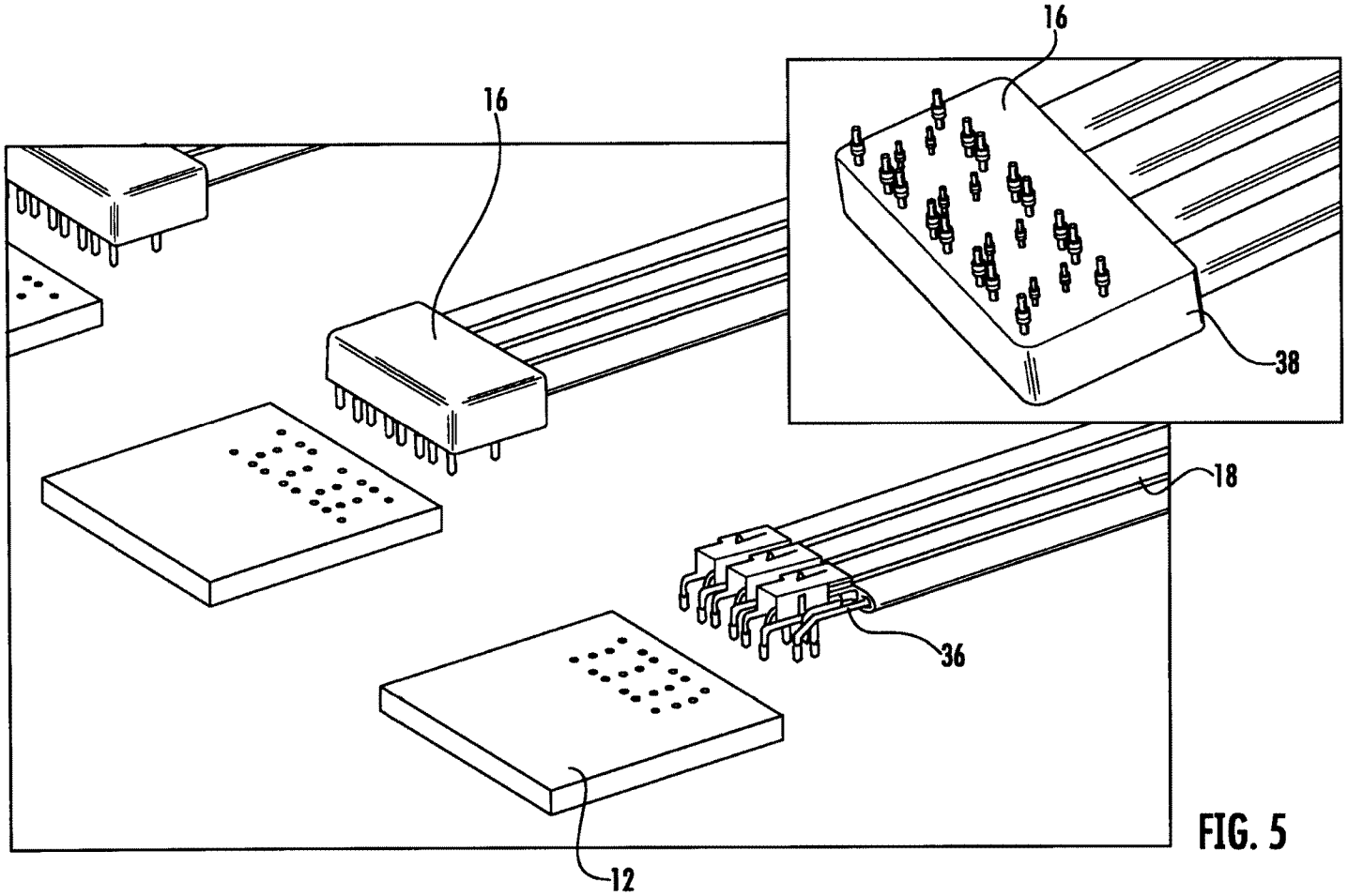
FIG. 5 illustrates a perspective and inset view of the first connector member of the interconnect cable assembly of FIG. 3.

FIG. 5 illustrates a perspective close up of first connector member 16. As illustrated, each first connector 16 houses the termination of bypass cable members 18. Individual wires 36 extending from bypass cable members are overmolded with terminal housing 38. Terminal housing 38 is then coupled to chip member 12.

Figure 6:
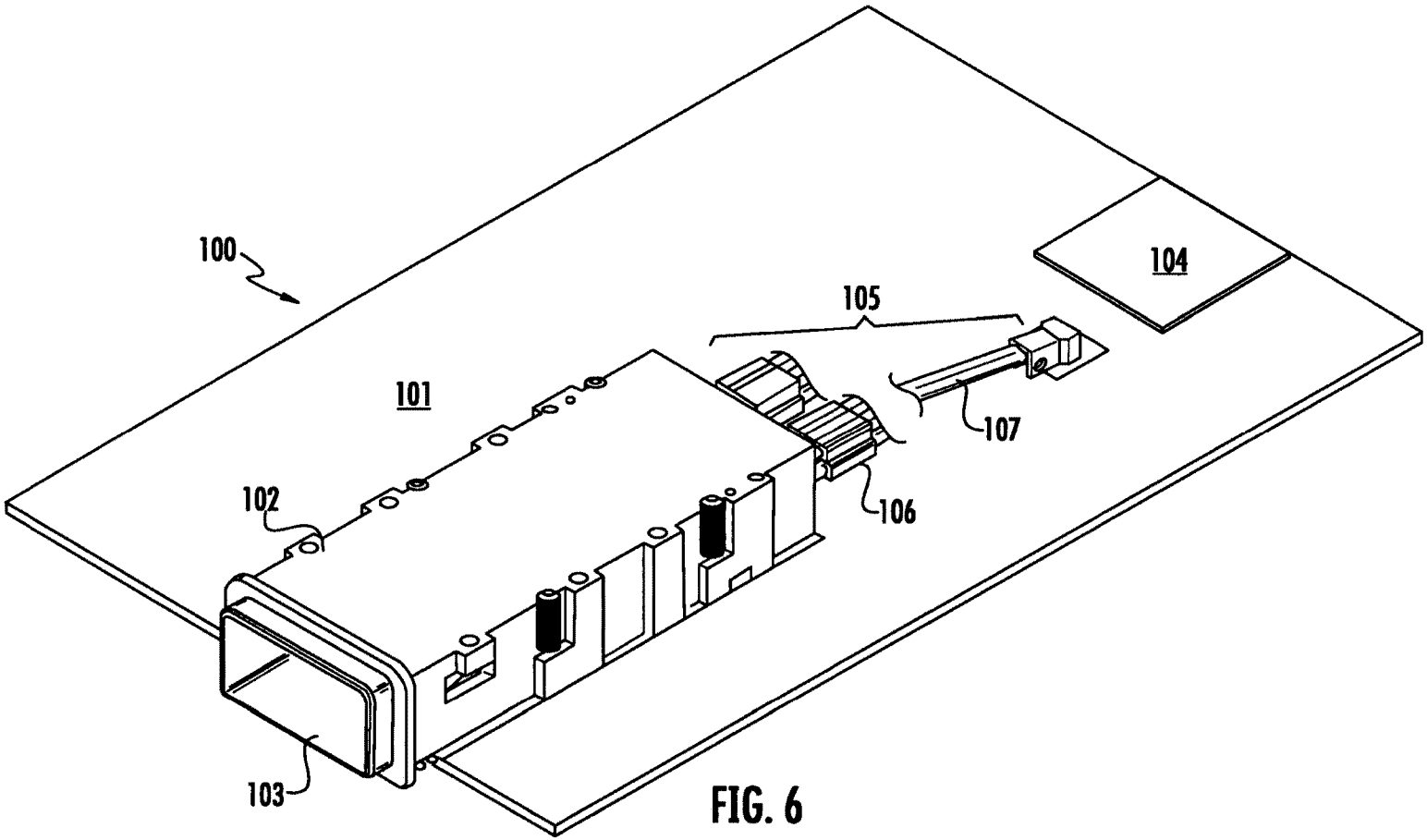
FIG. 6 is a perspective view of a second embodiment of a cable bypass assembly constructed in accordance with the Present Disclosure.
Figure 7:
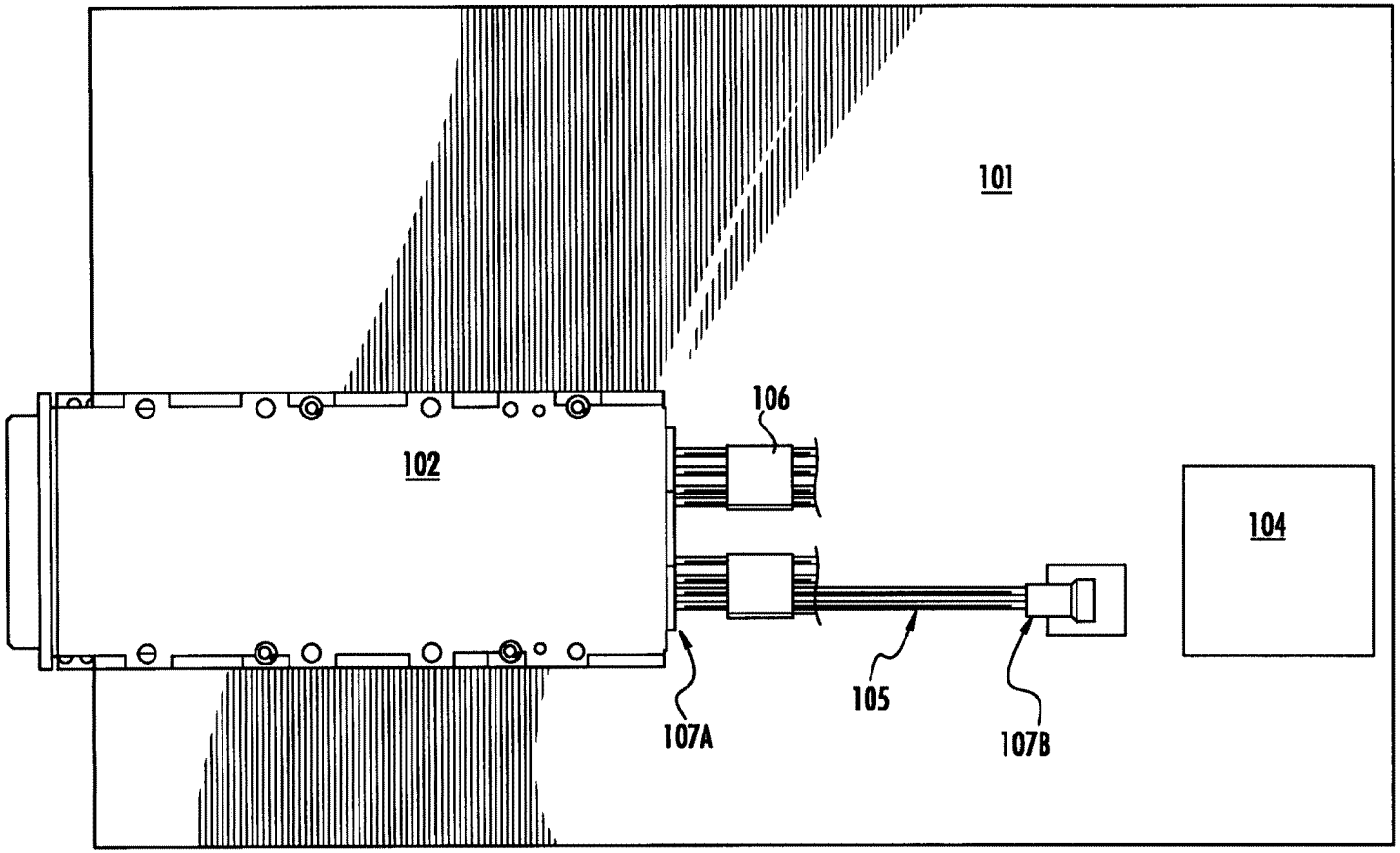
FIG. 7 is a top plan view of the cable bypass assembly of FIG. 6.
Figure 8:
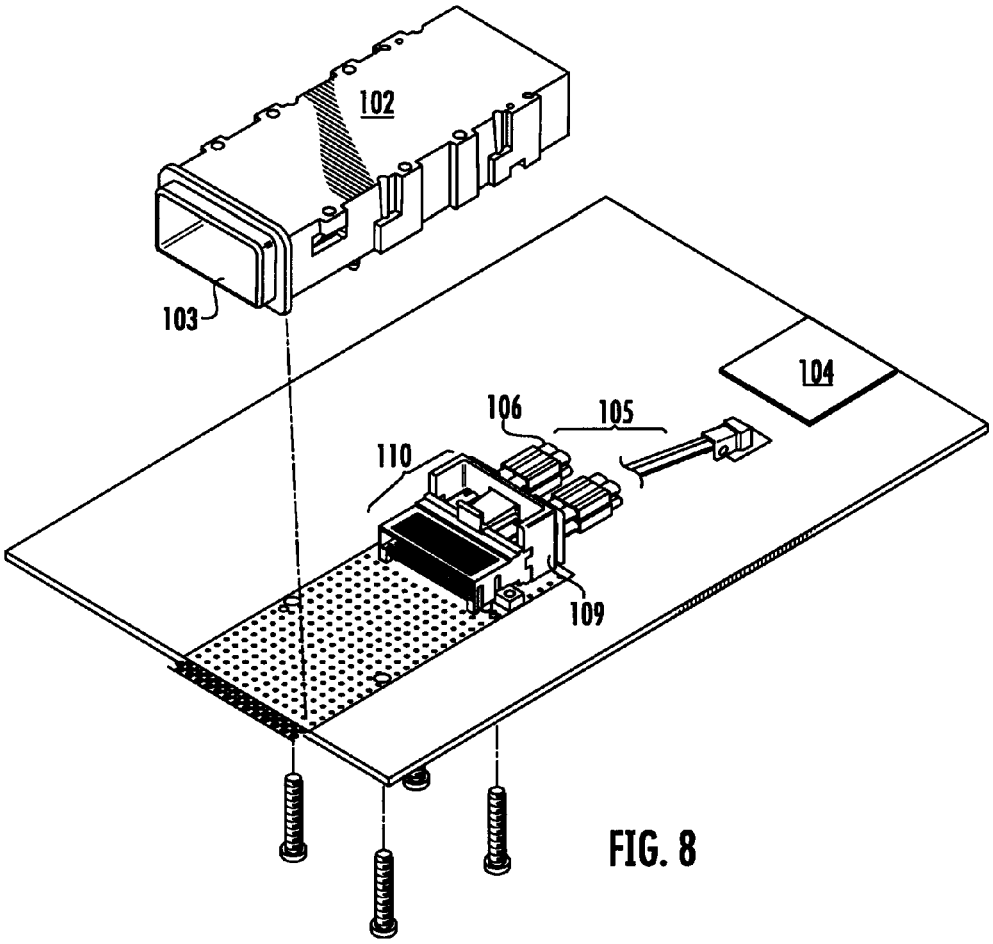
FIG. 8 is an exploded view of the assembly of FIG. 6, illustrating in greater detail the board connector to which the cable bypass assembly is terminated.
Figure 9:
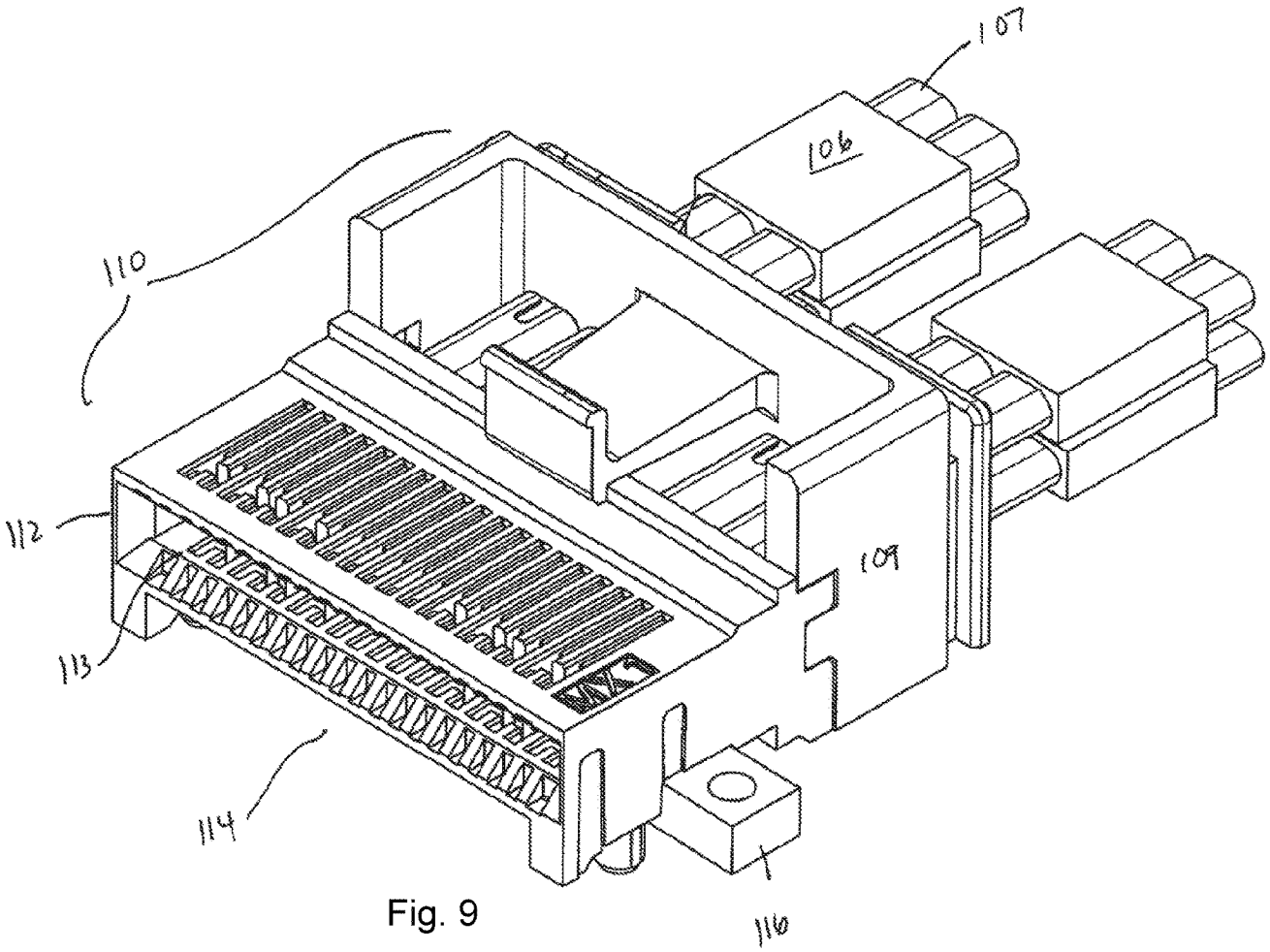
FIG. 9 is a perspective view of the board mounted connector of FIG. 8, with the first ends of the bypass assembly attached thereto.
Figure 10:
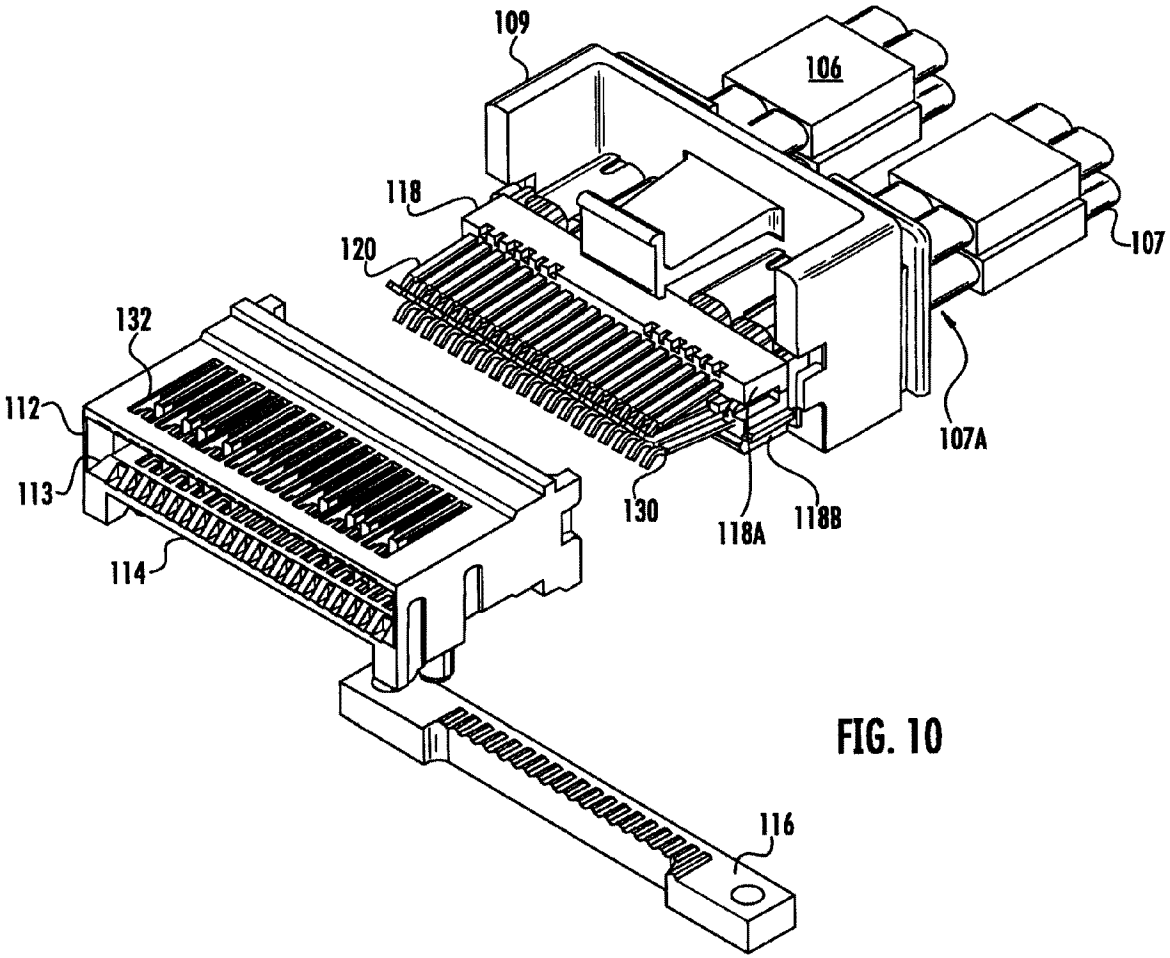
FIG. 10 is a partially exploded view of FIG. 9.

FIGS. 6-13E illustrate another embodiment of a bypass cable assembly 100 constructed in accordance with the principles of the Present Disclosure. As shown in FIG. 6, a circuit board 101 that is used in an electronic device (not shown) has mounted thereon a chip member 104, such as an ASIC, at one location and a shielding cage 102 mounted to the circuit board at another location, remote from the one location. The shielding cage 102 houses a receptacle connector assembly 110 that includes a receptacle connector 112 configured to receive the mating blade (typically the leading edge of a circuit card) of an opposing, mating connector (not shown) in a elongated card-receiving slot 113. The connector 112 may also include a channel 114 disposed underneath the card slot 113 to receive a polarizing member of the mating connector. The connector 112 is accessible through an opening 103 at one end of the shielding cage 102. A portion of the shielding cage 102 extends past the edge of the circuit board 101 and out of the enclosure which houses the circuit board 101. This opening 103 permits access to the connector 112 from the exterior of the device and permits the insertion of a mating connector, typically in the form of a plug connector, therein in order to connect the device to another device and permit the transfer of signals between them.

A bypass cable assembly 105 is provided to connect together, the connector 112 and the chip member 104, in order to form a signal transmission line extending therebetween for transmitting signals at high speeds of approximately 5 GHz and greater and preferably of approximately 10 GHz and greater. The cable assembly 105 includes a preselected length of cable 107 that has at a first end 107a thereof, a first termination assembly and at a second and opposite end 107b thereof, a second termination assembly. As shown best in FIG. 12B, each cable 107 may be of the "twin-ax" type, in which a pair of signal conductors 144A, 144B are positioned in spaced-apart relationship within an insulative body 142. This cable body 142 is surrounded by an outer conductive shielding layer 148 that is located underneath an exterior, insulative covering 140 and all of the cable elements may be formed as the single component illustrated. The structure of this particular type of twin-ax cable lends itself to uniformity throughout its length so that a consistent impedance profile is attained for the length of the cable. The cable assemblies 105 of this disclosure may include as few as one or two cables, or they may include greater numbers, such as the eight cables shown in FIGS. 6, 9 & 11.

In order to avoid losses that normally occur in the use of signal transmission lines in the circuit board 101 using FR-4 as the board material, the cables 107 are used as the signal transmission lines. As noted above, the cables 107 are made in a manner that controls their size, thickness and the position and spacing of the signal conductors 144A, 144B so as to define a constant impedance profile throughout the lengths of the cables. Accordingly, twin-ax type of cable is desirable as well as flexible circuitry where positioning of the conductors and insulators may be controlled to a high degree of tolerance. Problems with impedance profiles typically occur at the termination points of cables where the geometry of the cable disrupted in order to effect a termination. One such solution to this problem is disclosed in U.S. Pat. No. 6,454,605, issued Sep. 24, 2002 and assigned to the assignee of the Present Disclosure and which is hereby incorporated by reference, in its entirety.

Figure 12:
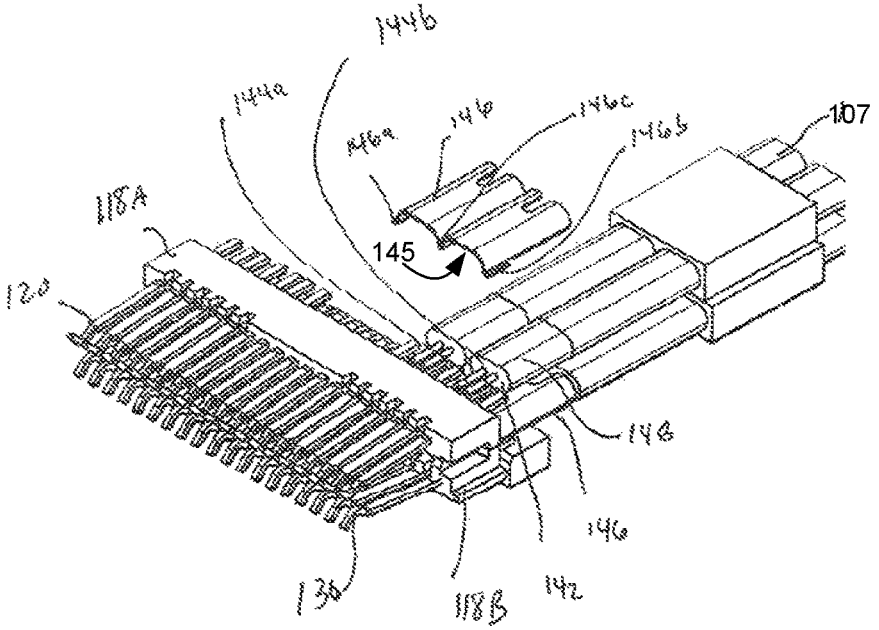
FIG. 12 is perspective view of four pairs of signal wires terminated to the board connector terminal assembly and with one set of the shielding extensions removed for clarity.
Figure 12A:
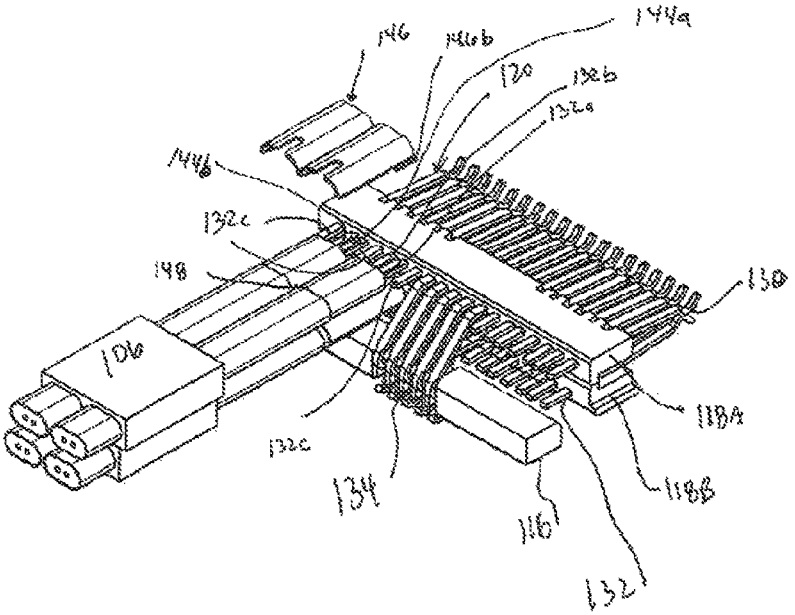
FIG. 12A is the same view as FIG. 12, but taken from the rear thereof.

The cable assemblies of the Present Disclosure are terminated at their opposite ends 107A, 107B in a manner that seeks to reduce the modification of the cable geometry in order to reduce the magnitude of the aforementioned discontinuities and to prevent to the extent possible excessive loss, noise and crosstalk. Returning to the drawings and in particular FIGS. 12 & 12A, it can be seen that the terminals 120 of the receptacle connector 112 have tail portions 132 that extend outwardly from the rear face of the terminal assembly supports 118A, 118B and contact portions 130 that extend forwardly within the card-receiving slot 113 of the body of the receptacle connector 112. The terminal contact and tail portions 130, 132a, 132b, extend in a continuous, generally horizontal extent through the connector without any vertical terminal extents that would provide an interruption of the horizontal extent. Consequently, as used herein, the term uninterrupted means a generally horizontal extent without any vertical portions. Similarly, "generally horizontal extent" also means that there are no vertical portions of the terminals that change the levels of the terminal contact and tail portions as would be found in terminals configured for surface mounting such as the low speed, power and status terminals 134 that are interposed between the high speed terminal sets. These non-high speed terminals 134 may be positioned with the use of a tail aligner block 116 or the like. In order to provide strain relief and to facilitate assembly, two cables may be held together by a block 106 applied to the cables 107 downstream of the termination areas.

In this manner, a "direct connection" is effected between the cable first end 107A and the connector 112, in a manner such that the signal terminal tail portions 132a, 132b are aligned with the exposed leads of the cable conductors 144A, 144B so that the exposed leads may be placed on the flat surfaces which the terminal tail portions 132a, 132b preferably provide. The inner shielding 148 of each cable 107 is pulled back over the exposed end of the cable and a shield extension 146 is provided for engaging these cable ends. The extension 146 is shown as a dual extension that can accommodate two cables. The shield extension 146 has what may be considered a cup portion 145 that is formed in a configuration that is generally complementary to the exterior configuration of the cable 107, and it is provided with contact feet 146a-c for contacting the associated terminal tail portions 132c of ground terminals in the receptacle connector 112.

The dual shield extension 146 shown in the drawings has two such cup portions 145 and three contact feet. Two contact feet 146a, 146b are formed along the outer edges of the cup portion 145, while the third contact foot 14c is formed between the cup portions 145. The contact surfaces 147 formed on the bottom of the contact feet are preferably aligned with each other along a common plane, shown as "H" in FIG. 12B. The conductors 144A, 144B of the cable 107 are also preferably aligned with the contact feet, along H as illustrated best in FIG. 12B. In this manner a "direct" connection is effected between first ends 107A of the cables 107 and the board mounted connector 112, thereby eliminating the need for surface mounting or through hole mounting of the connector high speed terminal tails, all of which contribute to loss, noise and crosstalk at high speeds. Terminals of the connector 112 for which high speed performance is not an issue, such as low speed signal terminals and/or power and status terminals 134, may be terminated in conventional manners mentioned above and they are shown in FIGS. 12 & 12A as surface mounted, and such terminals may be disposed between sets of high speed terminals as illustrated for additional separation between the high speed terminal sets. Removing the high speed signals of the receptacle connector from attachment directly to the board, reduces the cost in formation and manufacture of the circuit board 102. Additionally, the termination style shown in the drawings mirrors the geometry of the cable and provides generally complete shielding at the direct connection.

Figure 11:
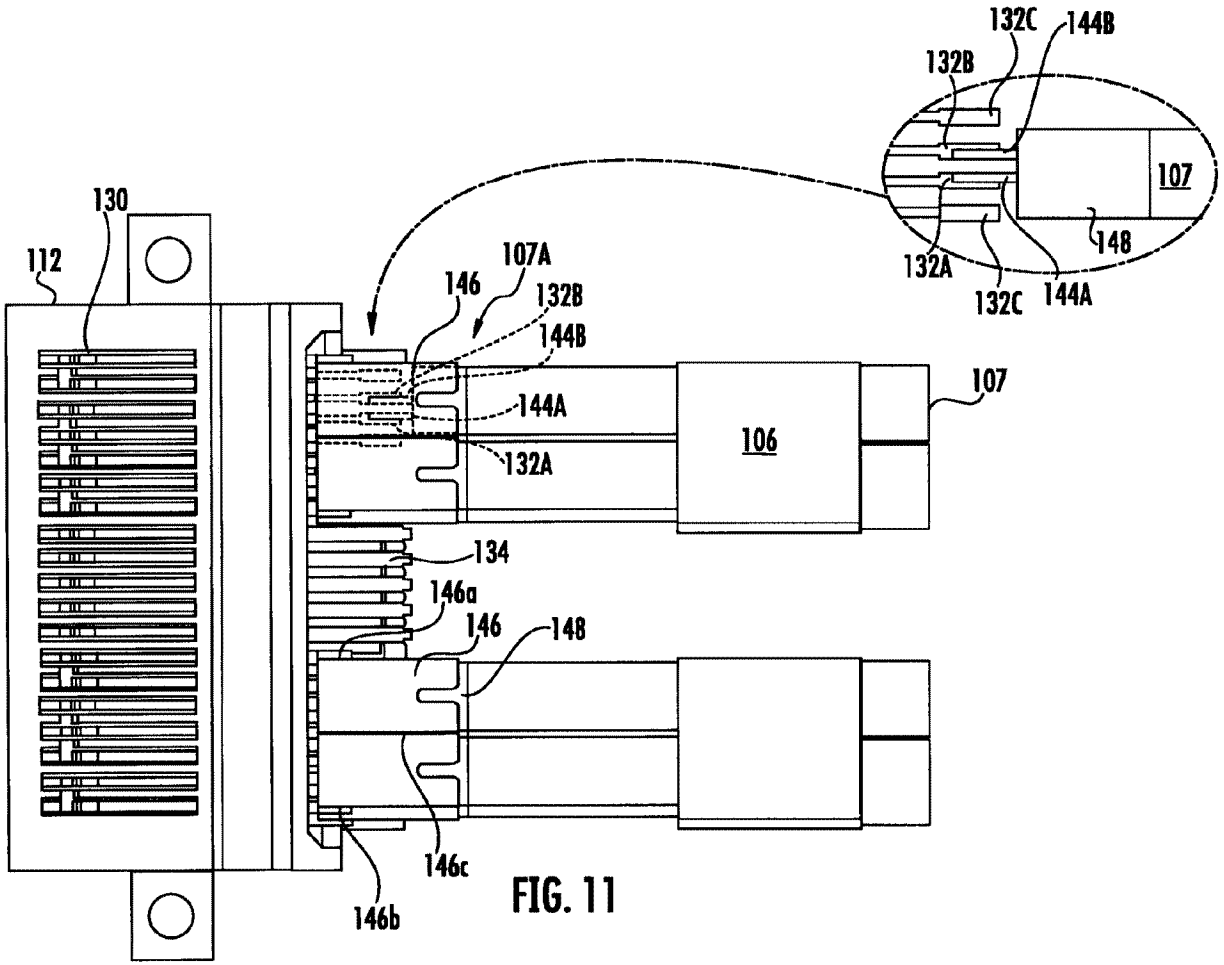
FIG. 11 is a top plan view of FIG. 9, with the EMI shield removed for clarity.
Figure 11A:
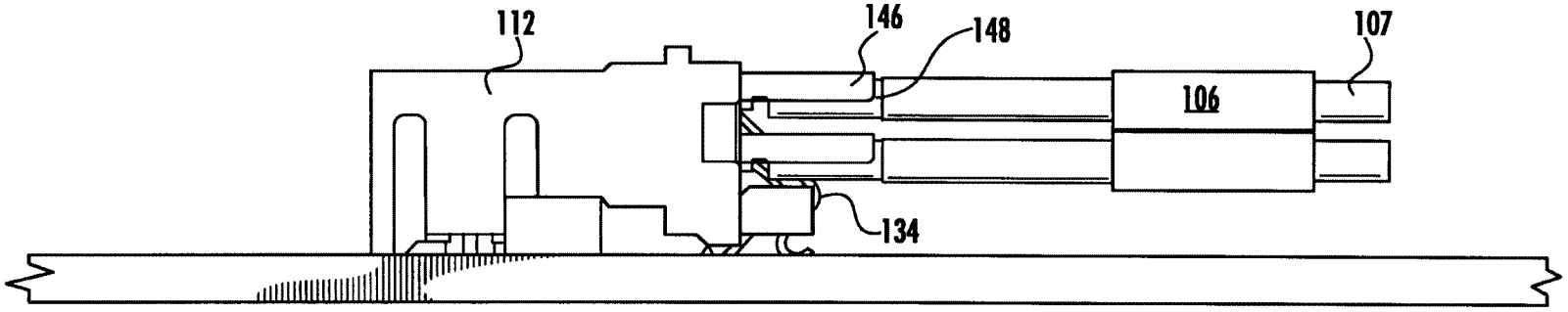
FIG. 11A is a side elevational view of FIG. 11.
Figure 12B:
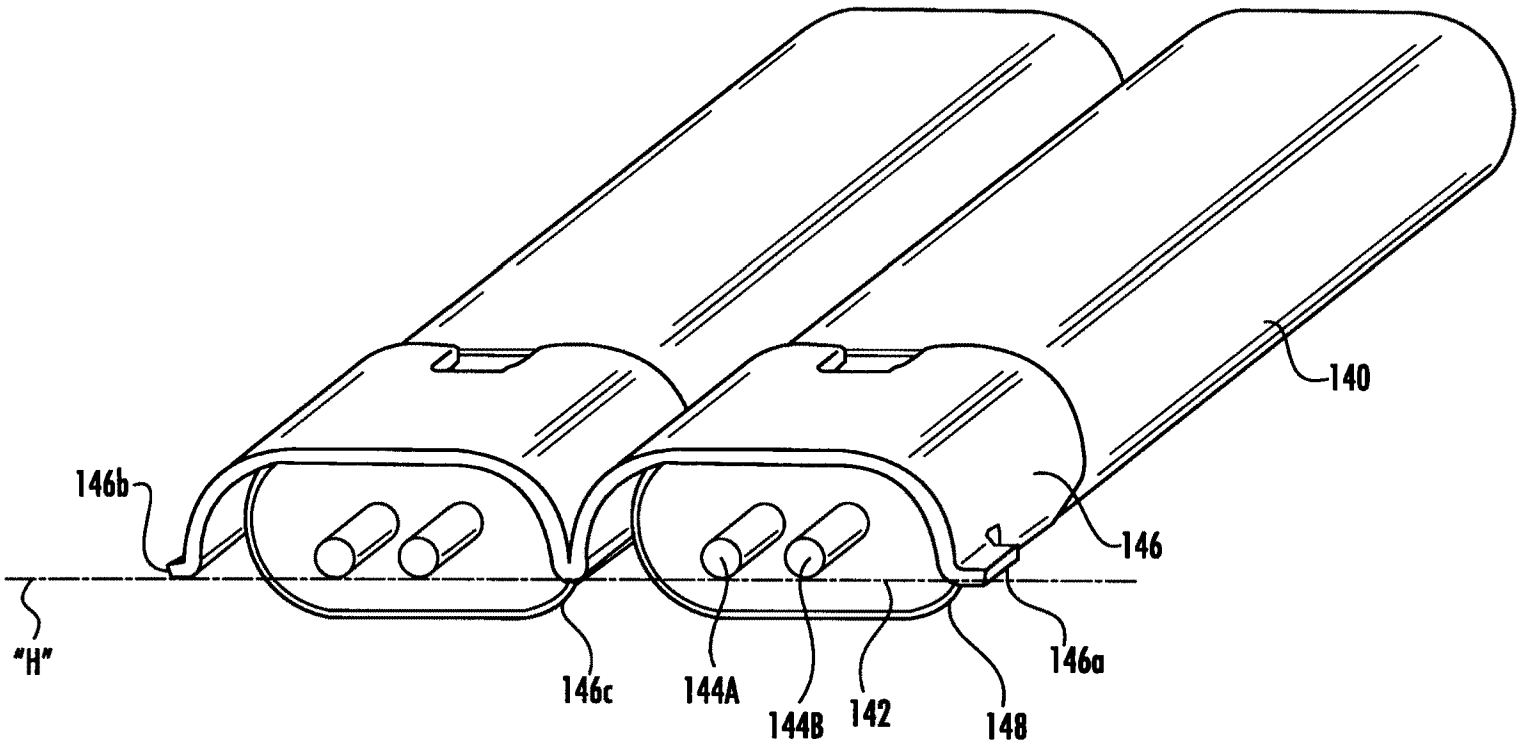
FIG. 12B is a end view of two pairs of signal wires with an associated shielding extension in place, illustrating the relative alignments of the signal conductors with each other and to the shielding of the cables.

The shield extensions 146 provide as close as can be attained complete shielding at the direct termination to the board connector and they extend forwardly to completely cover the exposed ends of the cable signal conductors 144A, 144B as shown in FIG. 11. The shield extension mounting feet 146a-c thereof are spaced apart and contact opposing tail portions of ground terminals of the first connector 112. The shield extension feet 146a-c and the conductors 144A, 144B of the cables 107 can be soldered or welded in their attachment to the connector terminals and the shield extensions 146 may be attached to the cables 107 by contact, a conductive adhesive, soldering or other suitable means. In this manner, the cable geometry is closely replicated in the termination area and more effective shielding is provided than just an ordinary ground wire to ground terminal connection. An EMI housing 109 may be utilized to provide an enclosure, in combination with the shielding cage 102 about the cable termination area.

Figure 13:
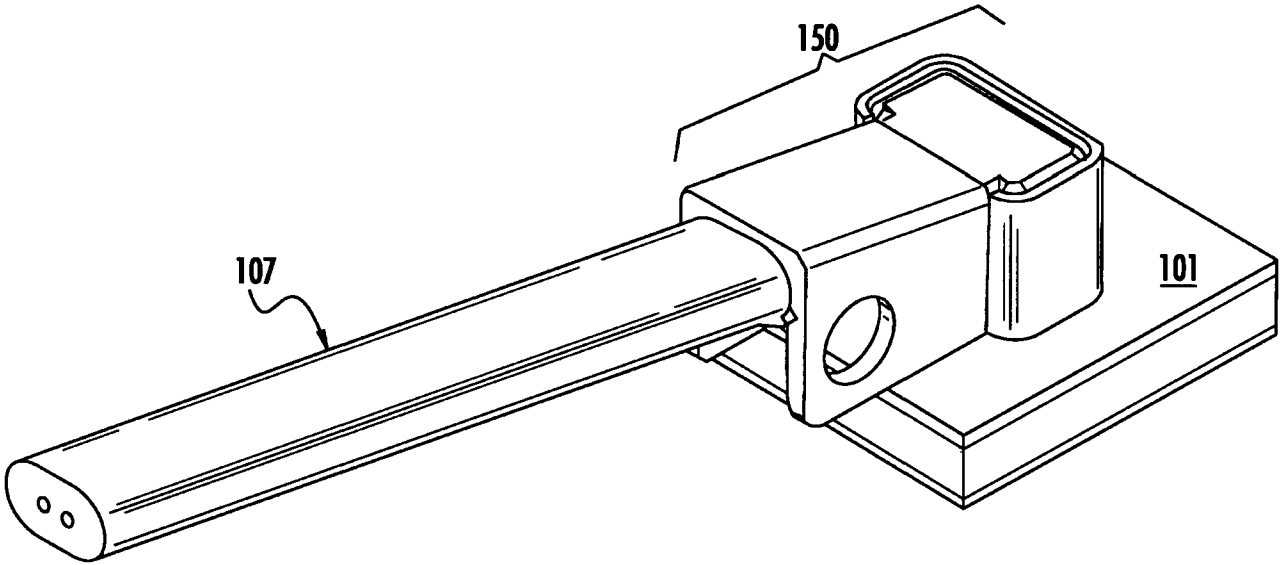
FIG. 13 is a perspective view of one manner of terminating the ends of the cables of the cable bypass assembly which is opposite that of the termination to the board mounted connector.
Figure 13A:
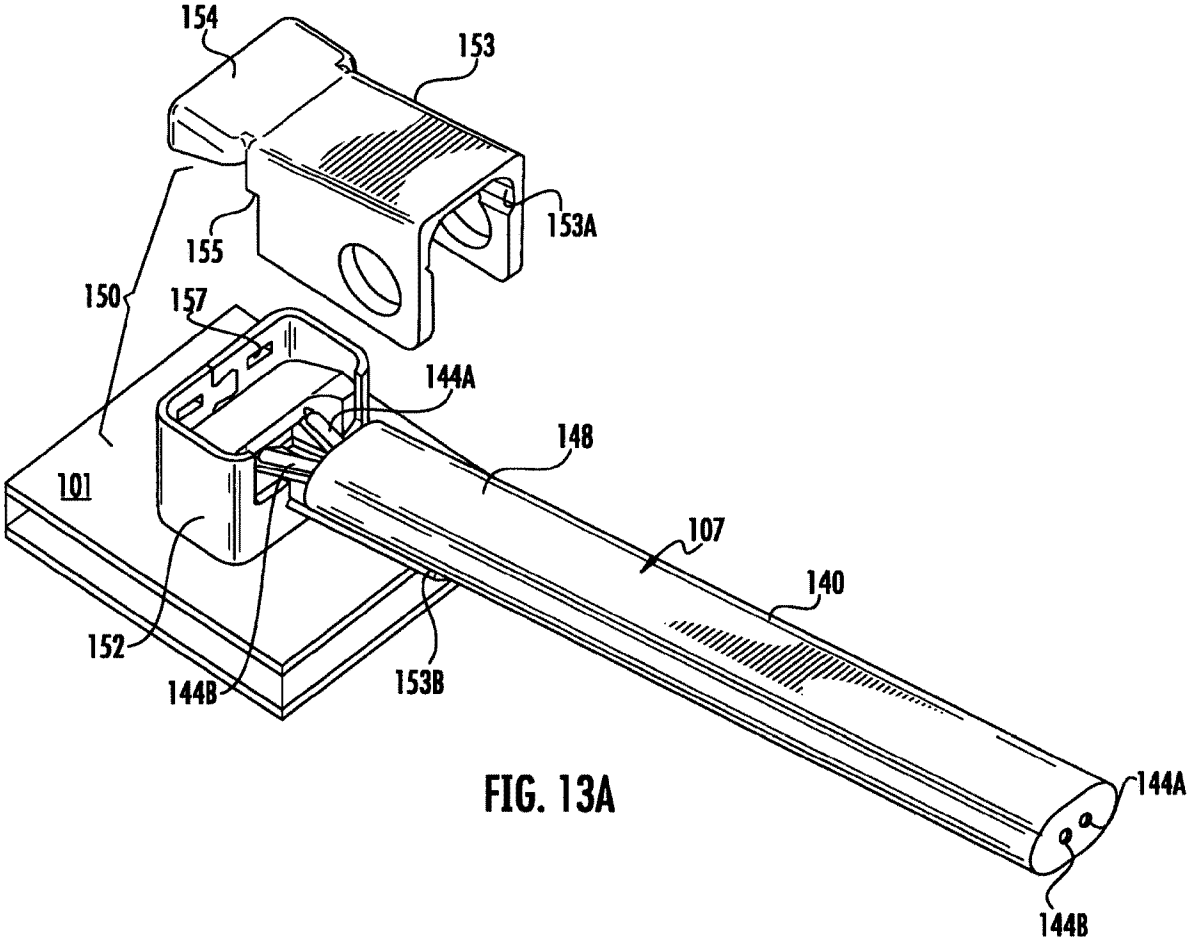
FIG. 13A is the same view as FIG. 13, but with one of the exterior shielding components removed for clarity.
Figure 13B:
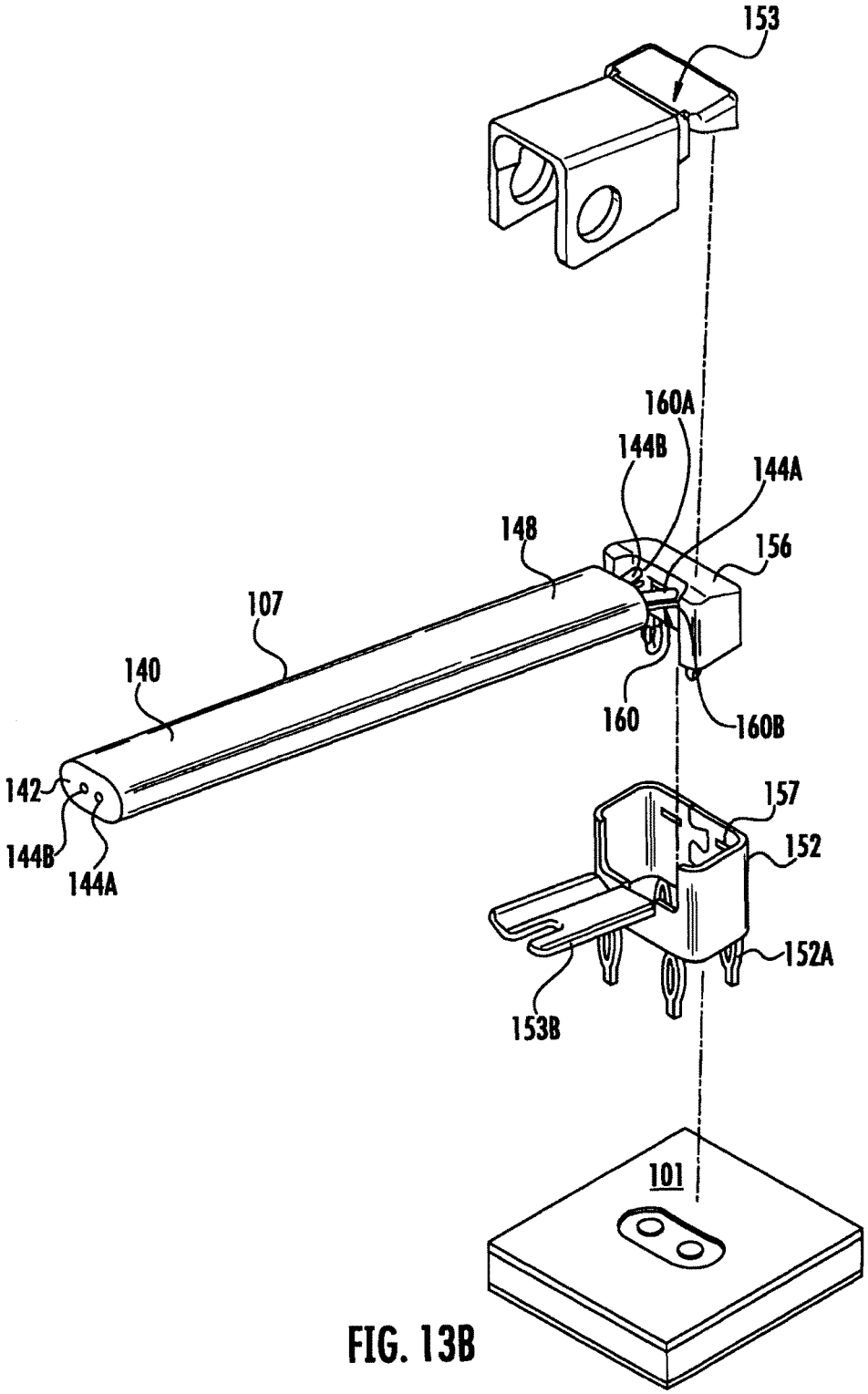
FIG. 13B is the same view as FIG. 13A but with the lower shielding component removed and the terminal support in place on the terminals attached to the second end of the cable.
Figure 13D:
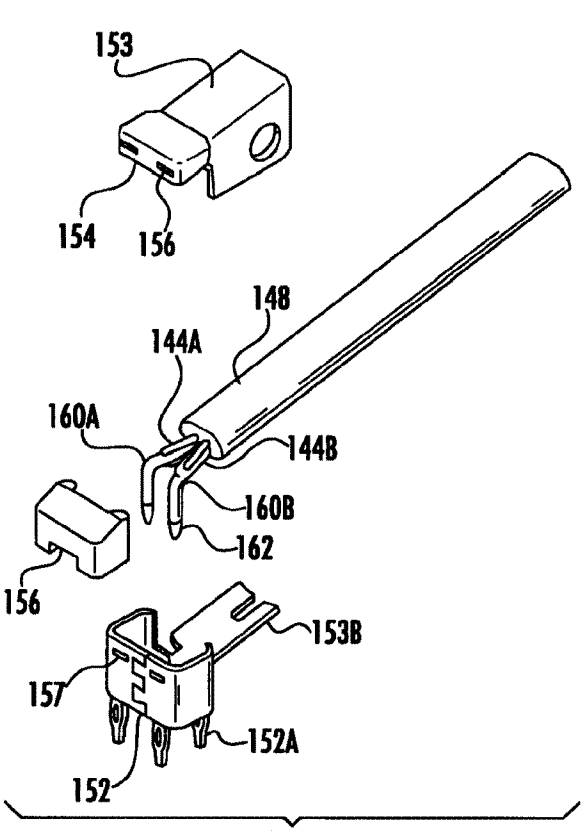
FIG. 13D is the same view as FIG. 13C, but taken from the other end thereof.
Figure 13C:
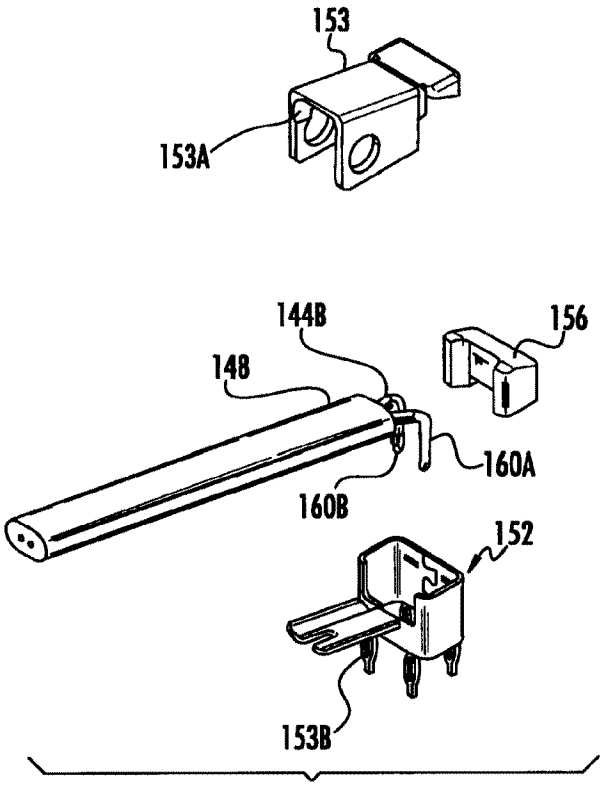
FIG. 13C is the same view as FIG. 13B but with the terminal support removed for clarity.
Figure 13E:
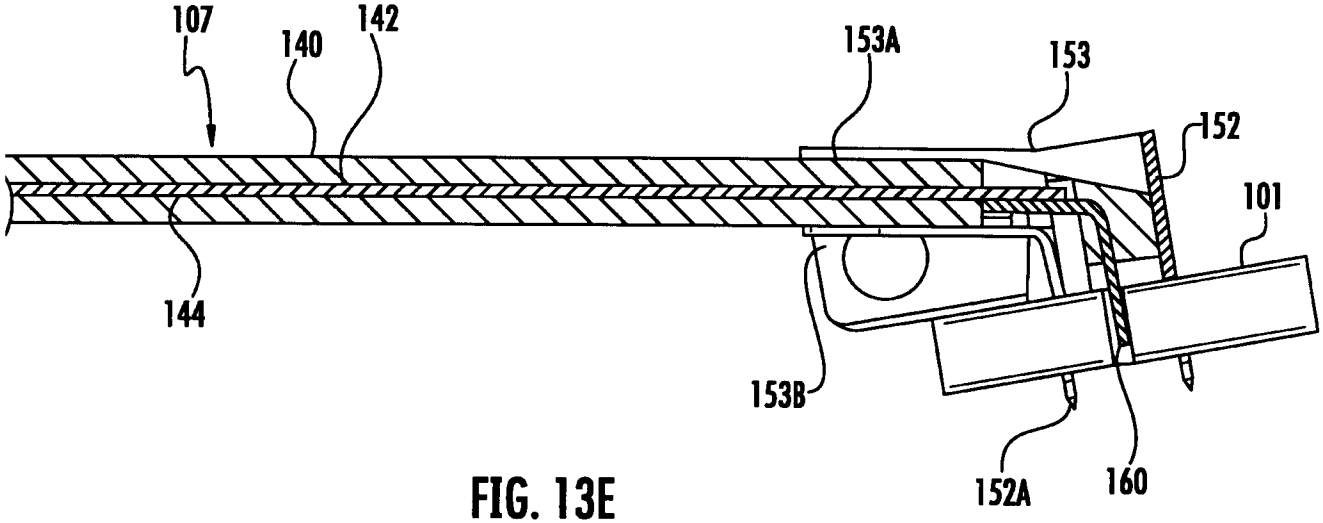
FIG. 13E is a sectional view of FIG. 13.

FIGS. 13A-D illustrate one form of termination that may be applied to the second ends of the cables 107, which may be either connected directly to the chip member or to the circuit board 101 in close proximity thereto. As illustrated in FIGS. 13B-D, the exposed leads of the cable conductors 144A, 144B are attached to signal terminals 160, shown as a pair of signal terminals 160A, 160B. These terminal preferably have flat tail portions 163 and through hole contact portions 162. The flat tail portions 163 preferably provide a flat surface to which the exposed conductors 144A, 144B may be contacted and attached via solder, welding or the like. The signal terminal 160 may be held in by an insulative support 156 that as shown is molded over body portions of the terminal 160, leaving the tail and contact portions 163, 162 exposed for termination purposes. A shield collar 152 is provided that houses the signal terminal support 156 and substantially encloses the signal terminals with a conductive shield. The shield collar 152 has a shield extension 153B that is similar in configuration to cable first end shield extensions 146 in that is has a cup portion 145 that contacts and receives the cable 107 and its inner shielding 148 therein. A cap member 153 is also provided and the cap member includes a block portion 154 that preferably abuts the terminal support 156 and which further preferably engages the shield collar 152 by way of tabs 156 that engage like holes 157 in the walls of the collar 152.

Figure 14:
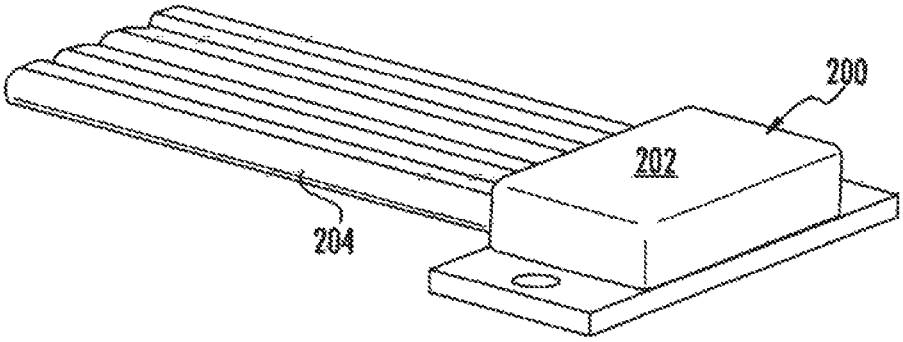
FIG. 14 is an embodiment of a termination structure for direct connection to a chip member.
Figure 14A:
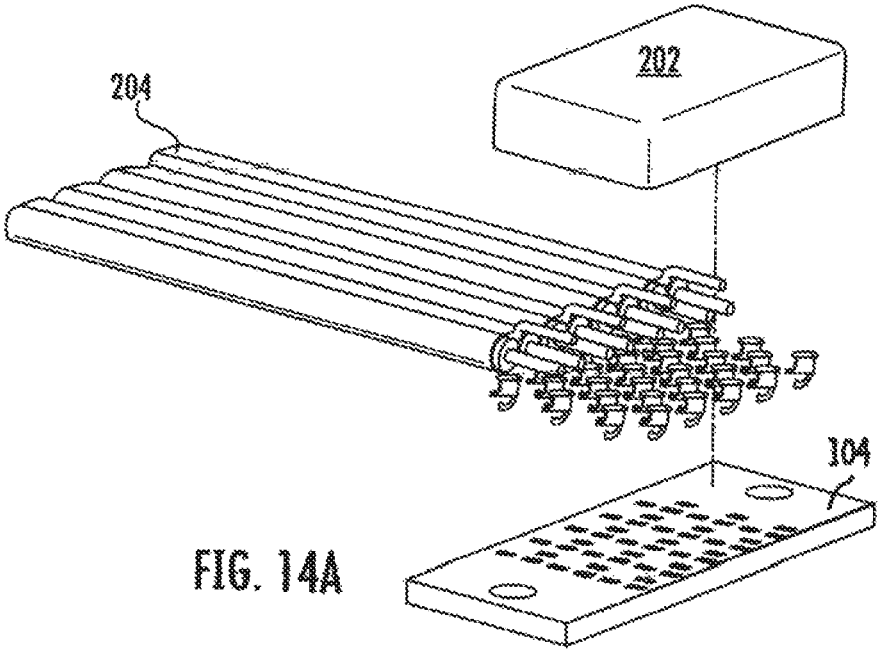
FIG. 14A is an exploded view of FIG. 14.
Figure 14B:
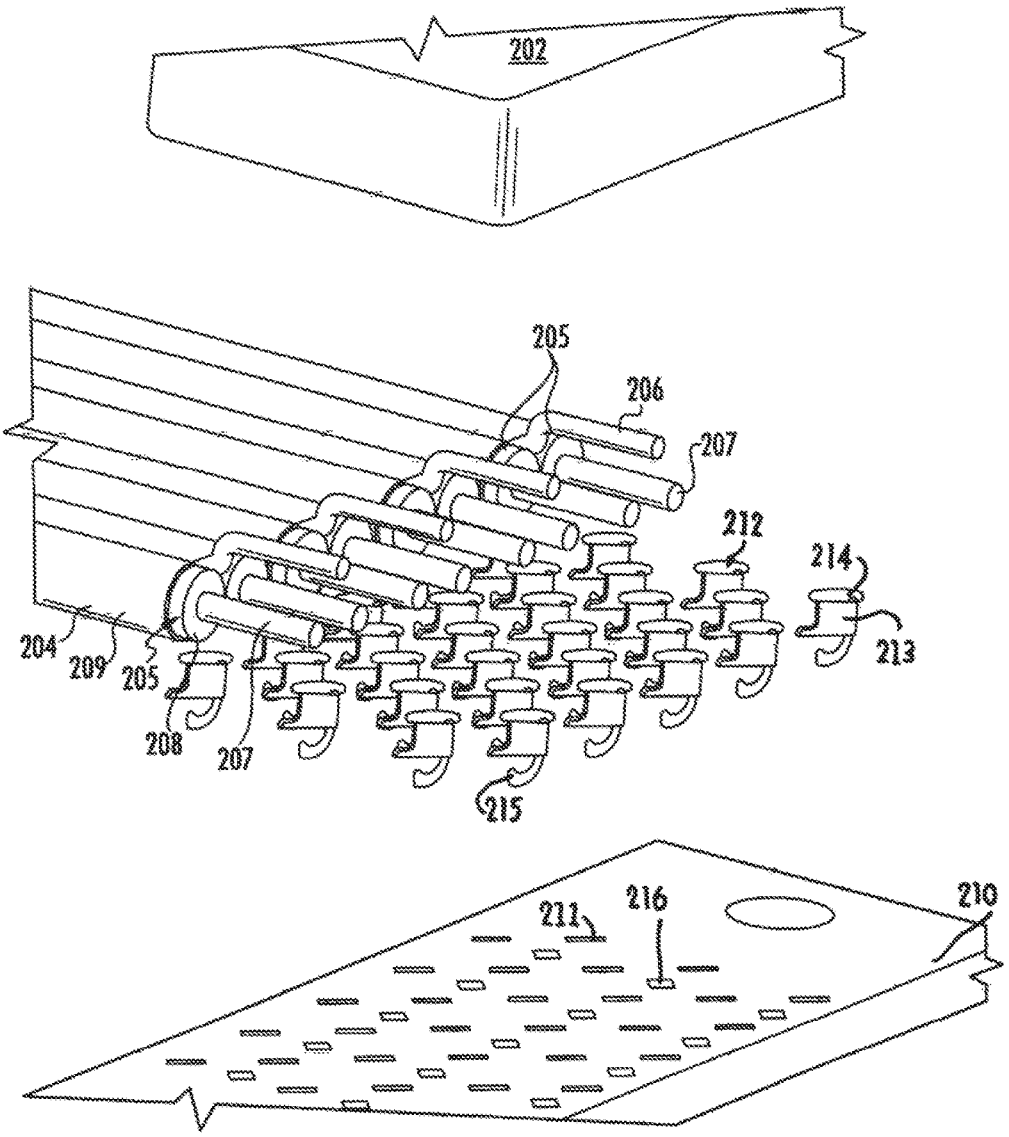
FIG. 14B is an enlarged detail view of FIG. 14A.

FIGS. 14-14B illustrate another embodiment of a manner or termination to a second connector. In this embodiment, the second connector 200 is one that is used to attach directly to the chip member 104, and typically to a top surface thereof. In this regard, the second connector 200 has a housing 202 that receives a plurality of cables 204, and the type of cables illustrated are of a different twin-ax structure, namely one in which each cable 204 contain a pair of signal wires 205 and a drain (ground) wire 206. The signal wires 205 have signal conductors 207 running their length and surrounded by an outer insulative covering 208 and an outer covering 209 is provided that encloses a pair of the signal wires 205 and an associated drain wire 206. A perforated base portion 210 of the housing 202 has a plurality of slots, or cavities 211, each of which is configured to receive a single terminal 212 therein. LGA-style terminals are illustrated and each such terminal 212 includes a body portion 213 that engages the housing cavity 211, a tail portion or mounting stub 214 that extends out of the cavity 211 and into contact with an exposed conductor 207 of the signal wires 205, and a contact portion 215 that extend out of the opposite end of the cavity 211. The second connector 200 also includes second cavities 216 that receive ground terminals (not shown) that are connected at their upper ends to the drain wires 206 and at their lower ends to the chip member 104. The termination arrangement of this connector 200 also maintains, to the extent possible the geometry of the cables 204 through the connector termination, in the sense that the triangular arrangement of the three wires of each cable is maintained until the point where the drain wire is attached to the ground terminal and then the extent of the ground terminal is spaced from the ends of the signal wire terminals 212 as evidenced by the pattern of the first and second terminal cavities 211, 216.

Figure 15:
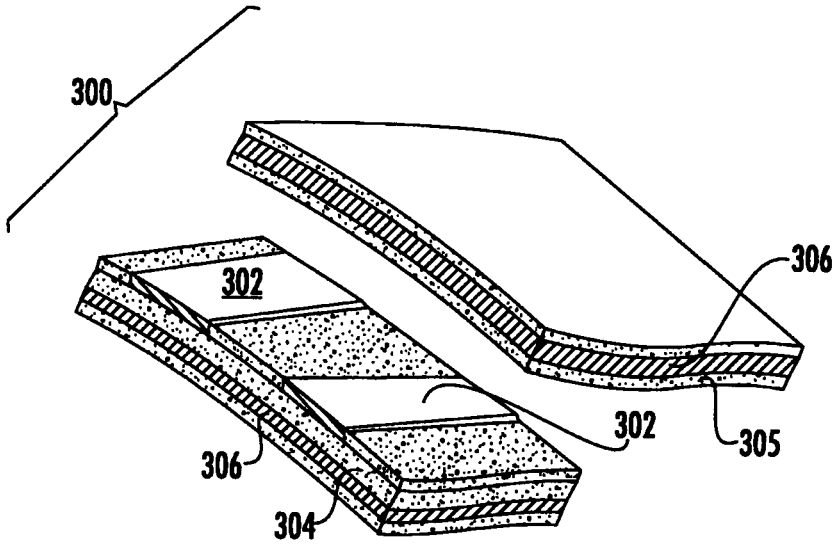
FIG. 15 is a partially exploded view of an extent of flexible circuitry which may be used as a signal transmission line in cable bypass assemblies of the disclosure; and, FIG. 16 is a graph comparing the losses between 12-inch lengths of signal transmission lines incorporated on a circuit board made from FR-4 material and a cable bypass assembly constructed in accordance with the principles of the disclosure.

FIG. 15 illustrates an alternate construction for use as a signal transmission line in accordance with the disclosure and takes the form of an extent of flat flexible circuitry 300. The extent includes a pair of signal conductors 302 that are spaced apart from each other and which run lengthwise between opposite ends of the cable 300. The conductors 302 are surrounded on their top and bottom surfaces and sides by insulative portions 304, 305. Ground shields 306 are provided to enclose the signal conductors 302, and although shown only as above and below the signal conductors 302, it will be understood that they may be disposed alongside of the signal conductors. With this sort of structure, the signal conductors may be exposed and aligned with terminal tails, while the ground shield extended to cover the termination areas in a manner similar to that shown above.

Figure 16:
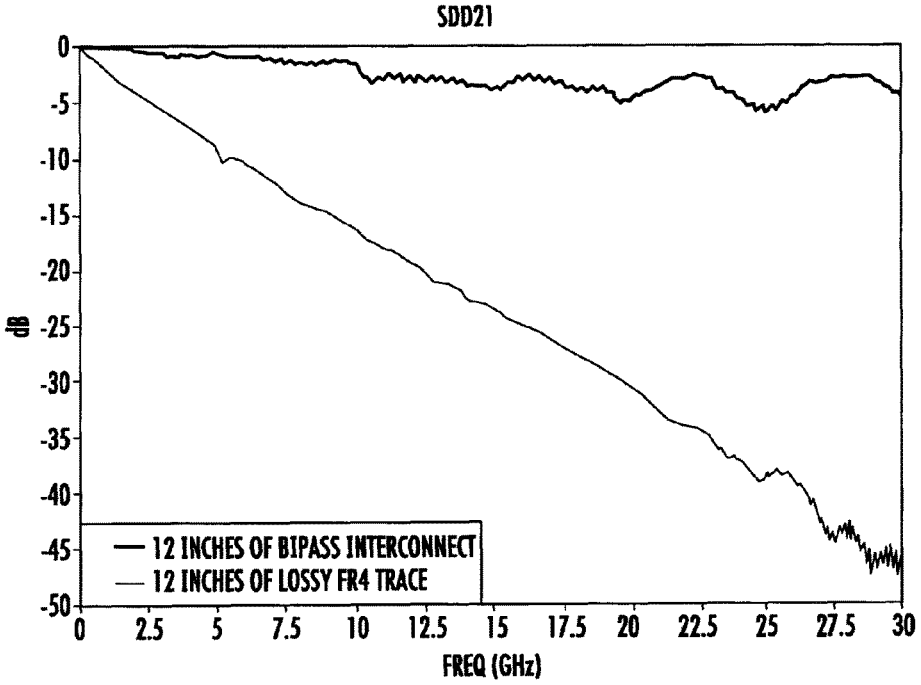

FIG. 16 is a graph comparing the loss between two 12-inch lengths of signal transmission lines, with one of the transmission lines comprising a pair of circuit traces formed in or on FR-4 circuit board material and the other transmission line comprising cables of the Present Disclosure. It can be seen from FIG. 16 that the use of the cable of the Present Disclosure leads to a very low loss transition that only breaks past the 5 dB mark at approximately the 20 GHz frequency. Within the range of testing error, we believe that the cables of the Present Disclosure have low loss characteristics of no greater than between about 5 dB and about 8 dB at frequencies greater than about 19 Ghz.

While a preferred embodiment of the Present Disclosure is shown and described, it is envisioned that those skilled in the art may devise various modifications without departing from the spirit and scope of the foregoing Description and the appended Claims.

What is claimed is:

1. A cable bypass assembly, the cable bypass assembly comprising:

a first connector, the first connector being configured for mounting to a circuit board, the first connector including a connector body, the connector body *including a card slot and* supporting a plurality of conductive terminals *that extend into the card slot*, the conductive terminals including contact portions and tail portions, the contact portions being held within the [connector body] *card slot* for contacting a mating blade of an opposing, mating connector, the tail portions extending [out from the connector body] *rearward of the card slot*;

an elongated cable, the elongated cable including:

a pair of signal conductors, the signal conductors being disposed within an insulative body portion of the elongated cable, the signal conductors extending, in a spaced-apart relationship, lengthwise through a body portion of the elongated cable, a conductive shield, the conductive shield extending over an exterior of the elongated cable body portion, an insulative outer covering, the insulative outer covering extending over the conductive shield, and opposing first and second free ends, the first free end terminating directly to selected terminal tails of the first connector in a manner so that the signal conductors are in electrical communication with a pair of signal terminal tails;

a shield extension member, the shield extension member being configured to engage a first length of the conductive shield exposed at the first free end and extending therefrom over the signal conductors attached to the pair of signal terminal tails, the shield extension member including at least two spaced apart mounting feet; and a second connector, the second connector including:

an insulative body, the insulative body supporting at least a pair of conductive signal terminals in a spaced-apart relationship, each conductive signal terminal including contact and tail portions *wherein the second free end is connected to the tail portions of the at least a pair of terminals in the insulative body*, and a shielding collar, the shielding collar enclosing a body portion of the second connector, the shielding collar includes an extension portion, the extension portion engaging and receiving the conductive shield exposed at the second free end*; wherein the cable bypass assembly is configured to support 10 GHz signaling*.

2. The cable bypass assembly of claim 1, further including a second cable, the second cable including a pair of signal conductors, the second cable signal conductors disposed lengthwise therethrough in a spaced-apart relationship, the second cable signal conductors being attached to corresponding signal terminal tails of the first connector alongside the elongated cable.

3. The cable bypass assembly of claim 1, wherein the shield extension member further includes a cup portion, the cup portion being configured to receive the first free end therein.

4. The cable bypass assembly of claim 2, wherein the shield extension member further includes a pair of cup portions, each cup portion [receivings] *receiving* ends of the two cables therein.

5. The cable bypass assembly of claim 4, wherein the shield extension member includes at least three mounting feet, two of the mounting feet being disposed on opposing side edges of the shield extension member and a third of the three mounting feet being disposed between the cup portions.

6. The cable bypass assembly of claim 5, wherein the mounting feet and the two cable signal conductors are aligned with each other.

7. The cable bypass assembly of claim 1, wherein the tail and contact portions extend uninterruptedly lengthwise in a general horizontal plane through the [first] connector body.

8. The cable bypass assembly of claim 1, wherein the elongated cable includes a preselected length of flexible circuitry.

9. [The cable bypass assembly of claim 1.] *A cable bypass assembly, the cable bypass assembly comprising:*

*a first connector, the first connector being configured for mounting to a circuit board, the first connector including a connector body, the connector body including a card slot and supporting a plurality of conductive terminals that extend into the card slot, the conductive terminals including contact portions and tail portions, the contact portions being held within the card slot for contacting a mating blade of an opposing, mating connector, the tail portions extending rearward of the card slot;*

*an elongated cable, the elongated cable including:*

*a pair of signal conductors, the signal conductors being disposed within an insulative body portion of the elongated cable, the signal conductors extending, in a spaced-apart relationship, lengthwise through a body portion of the elongated cable,*

*a conductive shield, the conductive shield extending over an exterior of the elongated cable body portion,*

*an insulative outer covering, the insulative outer covering extending over the conductive shield, and*

*opposing first and second free ends, the first free end terminating directly to selected terminal tails of the first connector in a manner so that the signal conductors are in electrical communication with a pair of signal terminal tails;*

*a shield extension member, the shield extension member being configured to engage a first length of the conductive shield exposed at the first free end and extending therefrom over the signal conductors attached to the pair of signal terminal tails, the shield extension member including at least two spaced apart mounting feet; and*

*a second connector, the second connector including:*

*an insulative body, the insulative body supporting at least a pair of conductive signal terminals in a spaced-apart relationship, each conductive signal terminal including contact and tail portions wherein the second free end is connected to the tail portions of the at least a pair of terminals in the insulative body, and*

*a shielding collar, the shielding collar enclosing a body portion of the second connector, the shielding collar includes an extension portion, the extension portion engaging and receiving the conductive shield exposed at the second free end,* wherein the shielding collar further includes at least one through-hole terminal, the through-hole terminal extending from the shielding collar and engaging a through-hole of the circuit board.

10. The cable bypass assembly of claim 1, wherein the shielding collar further includes a cap portion, the cap portion having a cup portion formed therein, the cup portion being configured to receive an exposed second end of the cable therein and contact a length of exposed cable shielding.

11. [The cable bypass assembly of claim 1.] *A cable bypass assembly, the cable bypass assembly comprising:*

*a first connector, the first connector being configured for mounting to a circuit board, the first connector including a connector body, the connector body including a card slot and supporting a plurality of conductive terminals that extend into the card slot, the conductive terminals including contact portions and tail portions, the contact portions being held within the card slot for contacting a mating blade of an opposing, mating connector, the tail portions extending rearward of the card slot;*

*an elongated cable, the elongated cable including:*

*a pair of signal conductors, the signal conductors being disposed within an insulative body portion of the elongated cable, the signal conductors extending, in a spaced-apart relationship, lengthwise through a body portion of the elongated cable,*

*a conductive shield, the conductive shield extending over an exterior of the elongated cable body portion,*

*an insulative outer covering, the insulative outer covering extending over the conductive shield, and*

*opposing first and second free ends, the first free end terminating directly to selected terminal tails of the first connector in a manner so that the signal conductors are in electrical communication with a pair of signal terminal tails;*

*a shield extension member, the shield extension member being configured to engage a first length of the conductive shield exposed at the first free end and extending therefrom over the signal conductors attached to the pair of signal terminal tails, the shield extension member including at least two spaced apart mounting feet; and*

*a second connector, the second connector including:*

*an insulative body, the insulative body supporting at least a pair of conductive signal terminals in a spaced-apart relationship, each conductive signal terminal including contact and tail portions wherein the second free end is connected to the tail portions of the at least a pair of terminals in the insulative body, and*

*a shielding collar, the shielding collar enclosing a body portion of the second connector, the shielding collar includes an extension portion, the extension portion engaging and receiving the conductive shield exposed at the second free end,* wherein the second connector is configured to connect directly to a chip member.

12. A cable bypass assembly with low loss performance at high data frequencies, the cable bypass assembly comprising:

a first connector, the first connector being configured for mounting to a circuit board, the first connector including a connector body *with a card slot*, the connector body supporting a plurality of conductive terminals, the conductive terminals including contact portions and tail portions, the contact portions being held within the

[connector body] *card slot* for contacting a mating blade of an opposing, mating connector, the tail portions extending [out from] *rearward of* the [connector body] *card slot*;

an elongated cable having, the elongated cable including: first and second opposing ends, a pair of signal conductors, the signal conductors being disposed within the elongated cable in a spaced-apart relationship and extending lengthwise through the elongated cable, and at least one conductive shield, each conductive shield extending lengthwise through the elongated cable and substantially enclosing the signal conductors, the signal conductors, at the first end, being terminated directly to selected terminal tails of the first connector in a manner so that the signal conductors are in electrical communication with a pair of signal terminal tails along a horizontal extent thereof;

a shield, the shield extending over the signal conductors attached to the signal terminal tails, the shield including a pair of ground shields; and a second connector, the second connector including an insulative body, the insulative body supporting at least a pair of conductive signal terminals in a spaced-apart relationship, each conductive signal terminal including contact and tail portions, the [cable] signal conductors at the second end thereof being terminated to the contact portions, and the [cable] *at least one* conductive shield being terminated to selected terminals of the second connector designated for ground purposes*; wherein the cable bypass assembly is configured to support 10 GHz signaling*.

13. The cable bypass assembly of claim 12, wherein the cable is an extent of flexible circuitry, the signal conductors including two signal conductors.

14. The cable bypass assembly of claim 13, wherein the ground shields are disposed on opposite sides of the signal conductors.

*15. A cable bypass assembly, the cable bypass assembly comprising:*

*a first connector, the first connector being configured for mounting to a circuit board, the first connector including a connector body with a card slot, the connector body supporting a plurality of conductive terminals, the conductive terminals including contact portions and tail portions, the contact portions extending in the card slot for contacting an opposing mating connector;*

*an elongated cable, the elongated cable including:*

*a pair of signal conductors, the signal conductors being disposed within an insulative body portion of the elongated cable, the signal conductors extending, in a spaced-apart relationship, lengthwise through a body portion of the elongated cable,*

*a conductive shield, the conductive shield extending over an exterior of the elongated cable body portion,*

*an insulative outer covering, the insulative outer covering extending over the conductive shield, and*

*opposing first and second free ends, the first free end terminating directly to selected terminal tails of the first connector in a manner so that the signal conductors are in electrical communication with a pair of signal terminal tails;*

*a shield extension member, the shield extension member being configured to engage a first length of the conductive shield exposed at the first free end and extending therefrom over the signal conductors attached to the pair of signal terminal tails, the shield extension member including at least two spaced apart mounting feet; and*

*a second connector, the second connector including:*

*an insulative body, the insulative body supporting at least a pair of conductive signal terminals in a spaced-apart relationship, each conductive signal terminal including contact and tail portions, and*

*a shielding collar, the shielding collar enclosing a body portion of the second connector, the shielding collar includes an extension portion, the extension portion engaging and receiving the conductive shield exposed at the second free end, wherein the cable bypass assembly is configured to support 10 GHz signaling.*

*16. The cable bypass assembly of claim 15, further including a second cable, the second cable including a pair of signal conductors, the second cable signal conductors disposed lengthwise therethrough in a spaced-apart relationship, the second cable signal conductors being attached to corresponding signal terminal tails of the first connector alongside the elongated cable.*

* * * * *